US007630188B2

(12) United States Patent  
Anthony

(10) Patent No.: US 7,630,188 B2  
(45) Date of Patent: *Dec. 8, 2009

(54) CONDITIONER WITH COPLANAR CONDUCTORS

(75) Inventor: William M. Anthony, Erie, PA (US)

(73) Assignee: X2Y Attenuators, LLC, Erie, PA (US)

( * ) Notice: Subject to any disclaimer, the term of this patent is extended or adjusted under 35 U.S.C. 154(b) by 38 days.

This patent is subject to a terminal disclaimer.

(21) Appl. No.: 11/817,639

(22) PCT Filed: Feb. 27, 2006

(86) PCT No.: PCT/US2006/006609

§ 371 (c)(1),
(2), (4) Date: Aug. 31, 2007

(87) PCT Pub. No.: WO2006/104613

PCT Pub. Date: Oct. 5, 2006

(65) Prior Publication Data

US 2008/0266741 A1    Oct. 30, 2008

Related U.S. Application Data

(60) Provisional application No. 60/656,910, filed on Mar. 1, 2005, provisional application No. 60/661,002, filed on Mar. 14, 2005, provisional application No. 60/668,992, filed on Apr. 7, 2005, provisional application No. 60/671,107, filed on Apr. 14, 2005, provisional application No. 60/671,532, filed on Apr. 15, 2005, provisional application No. 60/674,284, filed on Apr. 25, 2005, provisional application No. 60/751,273, filed on Dec. 19, 2005.

(51) Int. Cl.
*H02H 9/00* (2006.01)

(52) U.S. Cl. ................................ 361/118; 361/111

(58) Field of Classification Search ............... 361/118, 361/111; 205/462; 324/133

See application file for complete search history.

(56) References Cited

U.S. PATENT DOCUMENTS 3,240,621 A * 3/1966 Flower, Jr. et al. .......... 427/548
3,343,034 A    9/1967 Ovshinsky
3,573,677 A    4/1971 Detar (Continued)

FOREIGN PATENT DOCUMENTS

DE    197 28 692 A1    1/1999

(Continued)

OTHER PUBLICATIONS

PCT International Search Report for PCT/US01/48861, Oct. 1, 2002.

(Continued)

*Primary Examiner*—Stephen W Jackson
*Assistant Examiner*—Angela Brooks
(74) *Attorney, Agent, or Firm*—Neifeld IP Law, PC

(57) ABSTRACT

Disclosed are novel internal structures of energy conditioners (3a-3k) having A, B, and G master electrodes, novel assemblies of internal structures and internal structures of energy conditioners having A, B, and G electrodes, and novel arrangements of energy conditioners having A, B, and G master electrodes on connection structures.

35 Claims, 19 Drawing Sheets

U.S. PATENT DOCUMENTS

| | | |
|---|---|---|
| 3,736,471 A | 5/1973 | Donze et al. |
| 3,742,420 A | 6/1973 | Harnden, Jr. |
| 3,790,858 A | 2/1974 | Brancaleone et al. |
| 3,842,374 A | 10/1974 | Schlicke |
| 4,023,071 A | 5/1977 | Fussell |
| 4,119,084 A | 10/1978 | Eckels |
| 4,135,132 A | 1/1979 | Tafjord |
| 4,139,783 A | 2/1979 | Engeler |
| 4,191,986 A | 3/1980 | ta Huang et al. |
| 4,198,613 A | 4/1980 | Whitley |
| 4,259,604 A | 3/1981 | Aoki |
| 4,262,317 A | 4/1981 | Baumbach |
| 4,275,945 A | 6/1981 | Krantz et al. |
| 4,292,558 A | 9/1981 | Flick et al. |
| 4,308,509 A | 12/1981 | Tsuchiya et al. |
| 4,320,364 A | 3/1982 | Sakamoto et al. |
| 4,335,417 A | 6/1982 | Sakshaug et al. |
| 4,353,044 A | 10/1982 | Nossek |
| 4,366,456 A | 12/1982 | Ueno et al. |
| 4,384,263 A | 5/1983 | Neuman et al. |
| 4,394,639 A | 7/1983 | McGalliard |
| 4,412,146 A | 10/1983 | Futterer et al. |
| 4,494,092 A | 1/1985 | Griffin et al. |
| 4,533,931 A | 8/1985 | Mandai et al. |
| 4,553,114 A | 11/1985 | English et al. |
| 4,563,659 A | 1/1986 | Sakamoto |
| 4,586,104 A | 4/1986 | Standler |
| 4,587,589 A | 5/1986 | Marek |
| 4,590,537 A | 5/1986 | Sakamoto |
| 4,592,606 A | 6/1986 | Mudra |
| 4,612,140 A | 9/1986 | Mandai |
| 4,612,497 A | 9/1986 | Ulmer |
| 4,636,752 A | 1/1987 | Saito |
| 4,682,129 A | 7/1987 | Bakermans et al. |
| 4,685,025 A | 8/1987 | Carlomagno |
| 4,688,151 A | 8/1987 | Kraus et al. |
| 4,694,265 A | 9/1987 | Kupper |
| 4,698,721 A | 10/1987 | Warren |
| 4,703,386 A | 10/1987 | Speet et al. |
| 4,712,540 A | 12/1987 | Tucker et al. |
| 4,713,540 A | 12/1987 | Gilby et al. |
| 4,720,760 A | 1/1988 | Starr |
| 4,746,557 A | 5/1988 | Sakamoto et al. |
| 4,752,752 A | 6/1988 | Okubo |
| 4,760,485 A | 7/1988 | Ari et al. |
| 4,772,225 A | 9/1988 | Ulery |
| 4,777,460 A | 10/1988 | Okubo |
| 4,780,598 A | 10/1988 | Fahey et al. |
| 4,782,311 A | 11/1988 | Ookubo |
| 4,789,847 A | 12/1988 | Sakamoto et al. |
| 4,793,058 A | 12/1988 | Venaleck |
| 4,794,485 A | 12/1988 | Bennett |
| 4,794,499 A | 12/1988 | Ott |
| 4,795,658 A | 1/1989 | Kano et al. |
| 4,799,070 A | 1/1989 | Nishikawa |
| 4,801,904 A | 1/1989 | Sakamoto et al. |
| 4,814,295 A | 3/1989 | Mehta |
| 4,814,938 A | 3/1989 | Arakawa et al. |
| 4,814,941 A | 3/1989 | Speet et al. |
| 4,819,126 A | 4/1989 | Kornrumpf et al. |
| 4,845,606 A | 7/1989 | Herbert |
| 4,847,730 A | 7/1989 | Konno et al. |
| 4,904,967 A | 2/1990 | Morii et al. |
| 4,908,586 A | 3/1990 | Kling et al. |
| 4,908,590 A | 3/1990 | Sakamoto et al. |
| 4,924,340 A | 5/1990 | Sweet |
| 4,942,353 A | 7/1990 | Herbert et al. |
| 4,967,315 A | 10/1990 | Schelhorn |
| 4,978,906 A | 12/1990 | Herbert et al. |
| 4,990,202 A | 2/1991 | Murata et al. |
| 4,999,595 A | 3/1991 | Azumi et al. |
| 5,029,062 A | 7/1991 | Capel |
| 5,034,709 A | 7/1991 | Azumi et al. |
| 5,034,710 A | 7/1991 | Kawaguchi |
| 5,051,712 A | 9/1991 | Naito et al. |
| 5,059,140 A | 10/1991 | Philippson et al. |
| 5,065,284 A | 11/1991 | Hernandez |
| 5,073,523 A | 12/1991 | Yamada et al. |
| 5,079,069 A | 1/1992 | Howard et al. |
| 5,079,223 A | 1/1992 | Maroni |
| 5,079,669 A | 1/1992 | Williams |
| 5,089,688 A | 2/1992 | Fang et al. |
| 5,105,333 A | 4/1992 | Yamano et al. |
| 5,107,394 A | 4/1992 | Naito et al. |
| 5,109,206 A | 4/1992 | Carlile |
| 5,140,297 A | 8/1992 | Jacobs et al. |
| 5,140,497 A | 8/1992 | Kato et al. |
| 5,142,430 A | 8/1992 | Anthony |
| 5,148,005 A | 9/1992 | Fang et al. |
| 5,155,655 A | 10/1992 | Howard et al. |
| 5,161,086 A | 11/1992 | Howard et al. |
| 5,167,483 A | 12/1992 | Gardiner |
| 5,173,670 A | 12/1992 | Naito et al. |
| 5,179,362 A | 1/1993 | Okochi et al. |
| 5,181,859 A | 1/1993 | Foreman et al. |
| 5,186,647 A | 2/1993 | Denkmann et al. |
| 5,208,502 A | 5/1993 | Yamashita et al. |
| 5,219,812 A | 6/1993 | Doi et al. |
| 5,220,480 A | 6/1993 | Kershaw, Jr. et al. |
| 5,236,376 A | 8/1993 | Cohen |
| 5,243,308 A | 9/1993 | Shusterman et al. |
| 5,251,092 A | 10/1993 | Brady et al. |
| 5,257,950 A | 11/1993 | Lenker et al. |
| 5,261,153 A | 11/1993 | Lucas |
| 5,262,611 A | 11/1993 | Danysh et al. |
| 5,268,810 A | 12/1993 | DiMarco et al. |
| 5,290,191 A | 3/1994 | Foreman et al. |
| 5,299,956 A | 4/1994 | Brownell et al. |
| 5,300,760 A | 4/1994 | Batliwalla et al. |
| 5,310,363 A | 5/1994 | Brownell et al. |
| 5,311,408 A | 5/1994 | Ferchau et al. |
| 5,321,373 A | 6/1994 | Shusterman et al. |
| 5,321,573 A | 6/1994 | Person et al. |
| 5,326,284 A | 7/1994 | Bohbot et al. |
| 5,337,028 A | 8/1994 | White |
| 5,353,189 A | 10/1994 | Tomlinson |
| 5,353,202 A | 10/1994 | Ansell et al. |
| 5,357,568 A | 10/1994 | Pelegris |
| 5,362,249 A | 11/1994 | Carter |
| 5,362,254 A | 11/1994 | Siemon et al. |
| 5,378,407 A | 1/1995 | Chandler et al. |
| 5,382,928 A | 1/1995 | Davis et al. |
| 5,382,938 A | 1/1995 | Hansson et al. |
| 5,386,335 A | 1/1995 | Amano et al. |
| 5,396,201 A | 3/1995 | Ishizaki et al. |
| 5,401,952 A | 3/1995 | Sugawa |
| 5,405,466 A | 4/1995 | Naito et al. |
| 5,414,393 A | 5/1995 | Rose et al. |
| 5,414,587 A | 5/1995 | Kiser et al. |
| 5,420,553 A | 5/1995 | Sakamoto et al. |
| 5,432,484 A | 7/1995 | Klas et al. |
| 5,446,625 A | 8/1995 | Urbish et al. |
| 5,450,278 A | 9/1995 | Lee et al. |
| 5,451,919 A | 9/1995 | Chu et al. |
| RE35,064 E | 10/1995 | Hernandez |
| 5,455,734 A | 10/1995 | Foreman et al. |
| 5,461,351 A | 10/1995 | Shusterman |
| 5,463,232 A | 10/1995 | Yamashita et al. |
| 5,471,035 A | 11/1995 | Holmes |
| 5,477,933 A | 12/1995 | Nguyen |
| 5,481,238 A | 1/1996 | Carsten et al. |
| 5,483,407 A | 1/1996 | Anastasio et al. |
| 5,488,540 A | 1/1996 | Hatta |
| 5,491,299 A | 2/1996 | Naylor et al. |

| | | | | | |
|---|---|---|---|---|---|
| 5,493,260 A | 2/1996 | Park | 5,977,845 A | 11/1999 | Kitahara |
| 5,495,180 A | 2/1996 | Huang et al. | 5,978,231 A | 11/1999 | Tohya et al. |
| 5,500,629 A | 3/1996 | Meyer | 5,980,718 A | 11/1999 | Van Konynenburg et al. |
| 5,500,785 A | 3/1996 | Funada | 5,995,352 A | 11/1999 | Gumley |
| 5,512,196 A | 4/1996 | Mantese et al. | 5,999,067 A | 12/1999 | D'Ostilio |
| 5,531,003 A | 7/1996 | Seifried et al. | 5,999,398 A | 12/1999 | Makl et al. |
| 5,534,837 A | 7/1996 | Brandt | 6,004,752 A | 12/1999 | Loewy et al. |
| 5,535,101 A | 7/1996 | Miles et al. | 6,013,957 A | 1/2000 | Puzo et al. |
| 5,536,978 A | 7/1996 | Cooper et al. | 6,016,095 A | 1/2000 | Herbert |
| 5,541,482 A | 7/1996 | Siao | 6,018,448 A | 1/2000 | Anthony |
| 5,544,002 A | 8/1996 | Iwaya et al. | 6,021,564 A | 2/2000 | Hanson |
| 5,546,058 A | 8/1996 | Azuma et al. | 6,023,406 A | 2/2000 | Kinoshita et al. |
| 5,548,255 A | 8/1996 | Spielman | 6,031,710 A | 2/2000 | Wolf et al. |
| 5,555,150 A | 9/1996 | Newman, Jr. | 6,034,576 A | 3/2000 | Kuth |
| 5,568,348 A | 10/1996 | Foreman et al. | 6,034,864 A | 3/2000 | Naito et al. |
| 5,570,278 A | 10/1996 | Cross | 6,037,846 A | 3/2000 | Oberhammer |
| 5,583,359 A | 12/1996 | Ng et al. | 6,038,121 A | 3/2000 | Naito et al. |
| 5,586,007 A | 12/1996 | Funada | 6,042,685 A | 3/2000 | Shinada et al. |
| 5,592,391 A | 1/1997 | Muyshondt et al. | 6,046,898 A | 4/2000 | Seymour et al. |
| 5,612,657 A | 3/1997 | Kledzik | 6,052,038 A | 4/2000 | Savicki |
| 5,614,881 A | 3/1997 | Duggal et al. | 6,061,227 A | 5/2000 | Nogi |
| 5,619,079 A | 4/1997 | Wiggins et al. | 6,064,286 A | 5/2000 | Ziegner et al. |
| 5,624,592 A | 4/1997 | Paustian | 6,072,687 A | 6/2000 | Naito et al. |
| 5,640,048 A | 6/1997 | Selna | 6,075,211 A | 6/2000 | Tohya et al. |
| 5,645,746 A | 7/1997 | Walsh | 6,078,117 A | 6/2000 | Perrin et al. |
| 5,647,766 A | 7/1997 | Nguyen | 6,078,229 A | 6/2000 | Funada et al. |
| 5,647,767 A | 7/1997 | Scheer et al. | 6,088,235 A | 7/2000 | Chiao et al. |
| 5,668,511 A | 9/1997 | Furutani et al. | 6,091,310 A | 7/2000 | Utsumi et al. |
| 5,682,303 A | 10/1997 | Goad | 6,092,269 A | 7/2000 | Yializis et al. |
| 5,692,298 A | 12/1997 | Goetz et al. | 6,094,112 A | 7/2000 | Goldberger et al. |
| 5,700,167 A | 12/1997 | Pharney et al. | 6,094,339 A | 7/2000 | Evans |
| 5,708,553 A | 1/1998 | Hung | 6,097,260 A | 8/2000 | Whybrew et al. |
| 5,719,450 A | 2/1998 | Vora | 6,097,581 A | 8/2000 | Anthony |
| 5,719,477 A | 2/1998 | Tomihari | 6,104,258 A | 8/2000 | Novak |
| 5,719,750 A | 2/1998 | Iwane | 6,104,599 A | 8/2000 | Ahiko et al. |
| 5,751,539 A | 5/1998 | Stevenson et al. | 6,108,448 A | 8/2000 | Song et al. |
| 5,767,446 A | 6/1998 | Ha et al. | 6,111,479 A | 8/2000 | Myohga et al. |
| 5,789,999 A | 8/1998 | Barnett et al. | 6,120,326 A | 9/2000 | Brooks |
| 5,790,368 A | 8/1998 | Naito et al. | 6,121,761 A | 9/2000 | Herbert |
| 5,796,568 A | 8/1998 | Baiatu | 6,125,044 A | 9/2000 | Cherniski et al. |
| 5,796,595 A | 8/1998 | Cross | 6,130,585 A | 10/2000 | Whybrew et al. |
| 5,797,770 A | 8/1998 | Davis et al. | 6,137,392 A | 10/2000 | Herbert |
| 5,808,873 A | 9/1998 | Celaya et al. | 6,142,831 A | 11/2000 | Ashman et al. |
| 5,825,084 A | 10/1998 | Lau et al. | 6,144,547 A | 11/2000 | Retseptor |
| 5,825,628 A | 10/1998 | Garbelli et al. | 6,147,587 A | 11/2000 | Hadano et al. |
| 5,828,093 A | 10/1998 | Naito et al. | 6,150,895 A | 11/2000 | Steigerwald et al. |
| 5,828,272 A | 10/1998 | Romerein et al. | 6,157,528 A | 12/2000 | Anthony |
| 5,828,555 A | 10/1998 | Itoh | 6,157,547 A | 12/2000 | Brown et al. |
| 5,831,489 A | 11/1998 | Wire | 6,160,705 A | 12/2000 | Stearns et al. |
| 5,834,992 A | 11/1998 | Kato et al. | 6,163,454 A | 12/2000 | Strickler |
| 5,838,216 A | 11/1998 | White et al. | 6,163,456 A | 12/2000 | Suzuki et al. |
| 5,867,361 A | 2/1999 | Wolf et al. | 6,165,814 A | 12/2000 | Wark et al. |
| 5,870,272 A | 2/1999 | Seifried et al. | 6,175,287 B1 | 1/2001 | Lampen et al. |
| 5,875,099 A | 2/1999 | Maesaka et al. | 6,180,588 B1 | 1/2001 | Walters |
| 5,880,925 A | 3/1999 | DuPre et al. | 6,181,231 B1 | 1/2001 | Bartilson |
| 5,889,445 A | 3/1999 | Ritter et al. | 6,183,685 B1 | 2/2001 | Cowman et al. |
| 5,895,990 A | 4/1999 | Lau | 6,185,091 B1 | 2/2001 | Tanahashi et al. |
| 5,898,403 A | 4/1999 | Saitoh et al. | 6,188,565 B1 | 2/2001 | Naito et al. |
| 5,898,562 A | 4/1999 | Cain et al. | 6,191,475 B1 | 2/2001 | Skinner et al. |
| 5,905,627 A | 5/1999 | Brendel et al. | 6,191,669 B1 | 2/2001 | Shigemura |
| 5,907,265 A | 5/1999 | Sakuragawa et al. | 6,191,932 B1 | 2/2001 | Kuroda et al. |
| 5,908,151 A | 6/1999 | Elias | 6,195,269 B1 | 2/2001 | Hino |
| 5,909,155 A | 6/1999 | Anderson et al. | 6,198,123 B1 | 3/2001 | Linder et al. |
| 5,909,350 A | 6/1999 | Anthony | 6,198,362 B1 | 3/2001 | Harada et al. |
| 5,910,755 A | 6/1999 | Mishiro et al. | 6,204,448 B1 | 3/2001 | Garland et al. |
| 5,912,809 A | 6/1999 | Steigerwald et al. | 6,205,014 B1 | 3/2001 | Inomata et al. |
| 5,917,388 A | 6/1999 | Tronche et al. | 6,207,081 B1 | 3/2001 | Sasaki et al. |
| 5,926,377 A | 7/1999 | Nakao et al. | 6,208,063 B1 | 3/2001 | Horikawa |
| 5,928,076 A | 7/1999 | Clements et al. | 6,208,225 B1 | 3/2001 | Miller |
| 5,955,930 A | 9/1999 | Anderson et al. | 6,208,226 B1 | 3/2001 | Chen et al. |
| 5,959,829 A | 9/1999 | Stevenson et al. | 6,208,494 B1 | 3/2001 | Nakura et al. |
| 5,959,846 A | 9/1999 | Noguchi et al. | 6,208,495 B1 | 3/2001 | Wieloch et al. |
| 5,969,461 A | 10/1999 | Anderson et al. | 6,208,501 B1 | 3/2001 | Ingalls et al. |

| | | |
|---|---|---|
| 6,208,502 B1 | 3/2001 | Hudis et al. |
| 6,208,503 B1 | 3/2001 | Shimada et al. |
| 6,208,521 B1 | 3/2001 | Nakatsuka |
| 6,208,525 B1 | 3/2001 | Imasu et al. |
| 6,211,754 B1 | 4/2001 | Nishida et al. |
| 6,212,078 B1 | 4/2001 | Hunt et al. |
| 6,215,647 B1 | 4/2001 | Naito et al. |
| 6,215,649 B1 | 4/2001 | Appelt et al. |
| 6,218,631 B1 | 4/2001 | Hetzel et al. |
| 6,219,240 B1 | 4/2001 | Sasov |
| 6,222,427 B1 | 4/2001 | Kato et al. |
| 6,222,431 B1 | 4/2001 | Ishizaki et al. |
| 6,225,876 B1 | 5/2001 | Akino et al. |
| 6,226,169 B1 | 5/2001 | Naito et al. |
| 6,226,182 B1 | 5/2001 | Maehara |
| 6,229,226 B1 | 5/2001 | Kramer et al. |
| 6,236,572 B1 | 5/2001 | Teshome et al. |
| 6,240,621 B1 | 6/2001 | Nellissen et al. |
| 6,243,253 B1 | 6/2001 | DuPre et al. |
| 6,249,047 B1 | 6/2001 | Corisis |
| 6,249,439 B1 | 6/2001 | DeMore et al. |
| 6,252,161 B1 | 6/2001 | Hailey et al. |
| 6,262,895 B1 | 7/2001 | Forthun |
| 6,266,228 B1 | 7/2001 | Naito et al. |
| 6,266,229 B1 | 7/2001 | Naito et al. |
| 6,272,003 B1 | 8/2001 | Schaper |
| 6,281,704 B2 | 8/2001 | Ngai et al. |
| 6,282,074 B1 | 8/2001 | Anthony |
| 6,282,079 B1 | 8/2001 | Nagakari et al. |
| 6,285,109 B1 | 9/2001 | Katagiri et al. |
| 6,285,542 B1 | 9/2001 | Kennedy, III et al. |
| 6,292,350 B1 | 9/2001 | Naito et al. |
| 6,292,351 B1 | 9/2001 | Ahiko et al. |
| 6,309,245 B1 | 10/2001 | Sweeney |
| 6,310,286 B1 | 10/2001 | Troxel et al. |
| 6,313,584 B1 | 11/2001 | Johnson et al. |
| 6,320,547 B1 | 11/2001 | Fathy et al. |
| 6,324,047 B1 | 11/2001 | Hayworth |
| 6,324,048 B1 | 11/2001 | Liu |
| 6,325,672 B1 | 12/2001 | Belopolsky et al. |
| 6,327,134 B1 | 12/2001 | Kuroda et al. |
| 6,327,137 B1 | 12/2001 | Yamamoto et al. |
| 6,331,926 B1 | 12/2001 | Anthony |
| 6,331,930 B1 | 12/2001 | Kuroda |
| 6,342,681 B1 | 1/2002 | Goldberger et al. |
| 6,373,673 B1 | 4/2002 | Anthony |
| 6,388,856 B1 | 5/2002 | Anthony |
| 6,395,996 B1 | 5/2002 | Tsai et al. |
| 6,448,873 B1 | 9/2002 | Mostov |
| 6,456,481 B1 | 9/2002 | Stevenson |
| 6,469,595 B2 | 10/2002 | Anthony et al. |
| 6,498,710 B1 | 12/2002 | Anthony |
| 6,504,451 B1 | 1/2003 | Yamaguchi |
| 6,509,807 B1 | 1/2003 | Anthony et al. |
| 6,510,038 B1 | 1/2003 | Satou et al. |
| 6,522,516 B2 | 2/2003 | Anthony |
| 6,549,389 B2 | 4/2003 | Anthony et al. |
| 6,563,688 B2 | 5/2003 | Anthony et al. |
| 6,580,595 B2 | 6/2003 | Anthony et al. |
| 6,594,128 B2 | 7/2003 | Anthony |
| 6,603,372 B1 | 8/2003 | Ishizaki et al. |
| 6,603,646 B2 | 8/2003 | Anthony et al. |
| 6,606,011 B2 | 8/2003 | Anthony et al. |
| 6,606,237 B1 | 8/2003 | Naito et al. |
| 6,618,268 B2 | 9/2003 | Dibene, II et al. |
| 6,636,406 B1 | 10/2003 | Anthony |
| 6,650,525 B2 | 11/2003 | Anthony |
| 6,687,108 B1 | 2/2004 | Anthony et al. |
| 6,696,952 B2 | 2/2004 | Zirbes |
| 6,717,301 B2 | 4/2004 | De Daran et al. |
| 6,738,249 B1 | 5/2004 | Anthony et al. |
| 6,806,806 B2 | 10/2004 | Anthony |
| 6,873,513 B2 | 3/2005 | Anthony |
| 6,894,884 B2 | 5/2005 | Anthony, Jr. et al. |
| 6,950,293 B2 | 9/2005 | Anthony |
| 6,954,346 B2 | 10/2005 | Anthony |
| 6,995,983 B1 | 2/2006 | Anthony et al. |
| 7,042,303 B2 | 5/2006 | Anthony et al. |
| 7,042,703 B2 | 5/2006 | Anthony et al. |
| 7,050,284 B2 | 5/2006 | Anthony |
| 7,106,570 B2 | 9/2006 | Anthony, Jr. et al. |
| 7,110,227 B2 | 9/2006 | Anthony et al. |
| 7,110,235 B2 | 9/2006 | Anthony, Jr. et al. |
| 7,113,383 B2 * | 9/2006 | Anthony et al. ............ 361/118 |
| 7,141,899 B2 | 11/2006 | Anthony et al. |
| 7,180,718 B2 | 2/2007 | Anthony et al. |
| 7,224,564 B2 | 5/2007 | Anthony |
| 7,262,949 B2 | 8/2007 | Anthony |
| 7,274,549 B2 | 9/2007 | Anthony |
| 7,321,485 B2 * | 1/2008 | Anthony et al. ............ 361/118 |
| 2001/0001989 A1 | 5/2001 | Smith |
| 2001/0002105 A1 | 5/2001 | Brandelik et al. |
| 2001/0002624 A1 | 6/2001 | Khandros et al. |
| 2001/0008288 A1 | 7/2001 | Kimura et al. |
| 2001/0008302 A1 | 7/2001 | Murakami et al. |
| 2001/0008478 A1 | 7/2001 | McIntosh et al. |
| 2001/0008509 A1 | 7/2001 | Watanabe |
| 2001/0009496 A1 | 7/2001 | Kappel et al. |
| 2001/0010444 A1 | 8/2001 | Pahl et al. |
| 2001/0011763 A1 | 8/2001 | Ushijima et al. |
| 2001/0011934 A1 | 8/2001 | Yamamoto |
| 2001/0011937 A1 | 8/2001 | Satoh et al. |
| 2001/0013626 A1 | 8/2001 | Fujii |
| 2001/0015643 A1 | 8/2001 | Goldfine et al. |
| 2001/0015683 A1 | 8/2001 | Mikami et al. |
| 2001/0017576 A1 | 8/2001 | Kondo et al. |
| 2001/0017579 A1 | 8/2001 | Kurata |
| 2001/0019869 A1 | 9/2001 | Hsu |
| 2001/0020879 A1 | 9/2001 | Takahashi et al. |
| 2001/0021097 A1 | 9/2001 | Ohya et al. |
| 2001/0022547 A1 | 9/2001 | Murata et al. |
| 2001/0023983 A1 | 9/2001 | Kobayashi et al. |
| 2001/0024148 A1 | 9/2001 | Gerstenberg et al. |
| 2001/0028581 A1 | 10/2001 | Yanagisawa et al. |
| 2001/0029648 A1 | 10/2001 | Ikada et al. |
| 2001/0031191 A1 | 10/2001 | Korenaga |
| 2001/0033664 A1 | 10/2001 | Poux et al. |
| 2001/0035801 A1 | 11/2001 | Gilbert |
| 2001/0035802 A1 | 11/2001 | Kadota |
| 2001/0035805 A1 | 11/2001 | Suzuki et al. |
| 2001/0037680 A1 | 11/2001 | Buck et al. |
| 2001/0039834 A1 | 11/2001 | Hsu |
| 2001/0040484 A1 | 11/2001 | Kim |
| 2001/0040487 A1 | 11/2001 | Ikata et al. |
| 2001/0040488 A1 | 11/2001 | Gould et al. |
| 2001/0041305 A1 | 11/2001 | Sawada et al. |
| 2001/0043100 A1 | 11/2001 | Tomita et al. |
| 2001/0043129 A1 | 11/2001 | Hidaka et al. |
| 2001/0043450 A1 | 11/2001 | Seale et al. |
| 2001/0043453 A1 | 11/2001 | Narwankar et al. |
| 2001/0045810 A1 | 11/2001 | Poon et al. |
| 2001/0048581 A1 | 12/2001 | Anthony et al. |
| 2001/0048593 A1 | 12/2001 | Yamauchi et al. |
| 2001/0048906 A1 | 12/2001 | Lau et al. |
| 2001/0050550 A1 | 12/2001 | Yoshida et al. |
| 2001/0050600 A1 | 12/2001 | Anthony et al. |
| 2001/0050837 A1 | 12/2001 | Stevenson et al. |
| 2001/0052833 A1 | 12/2001 | Enokihara et al. |
| 2001/0054512 A1 | 12/2001 | Belau et al. |
| 2001/0054734 A1 | 12/2001 | Koh et al. |
| 2001/0054756 A1 | 12/2001 | Horiuchi et al. |
| 2001/0054936 A1 | 12/2001 | Okada et al. |
| 2002/0000521 A1 | 1/2002 | Brown |
| 2002/0000583 A1 | 1/2002 | Kitsukawa et al. |
| 2002/0000821 A1 | 1/2002 | Haga et al. |
| 2002/0000893 A1 | 1/2002 | Hidaka et al. |

| | | | | | | |
|---|---|---|---|---|---|---|
| 2002/0000895 | A1 | 1/2002 | Takahashi et al. | JP | 06-053049 | 2/1994 |
| 2002/0003454 | A1 | 1/2002 | Sweeney et al. | JP | 06-053075 | 2/1994 |
| 2002/0005880 | A1 | 1/2002 | Ashe et al. | JP | 06-053077 | 2/1994 |
| 2002/0024787 | A1 | 2/2002 | Anthony | JP | 06-053078 | 2/1994 |
| 2002/0027263 | A1 | 3/2002 | Anthony et al. | JP | 06-084695 | 3/1994 |
| 2002/0027760 | A1 | 3/2002 | Anthony | JP | 06-151014 | 5/1994 |
| 2002/0044401 | A1 | 4/2002 | Anthony et al. | JP | 06-151244 | 5/1994 |
| 2002/0075096 | A1 | 6/2002 | Anthony | JP | 06-151245 | 5/1994 |
| 2002/0079116 | A1 | 6/2002 | Anthony | JP | 06-325977 | 11/1994 |
| 2002/0089812 | A1 | 7/2002 | Anthony et al. | JP | 07-235406 | 9/1995 |
| 2002/0113663 | A1 | 8/2002 | Anthony et al. | JP | 07-235852 | 9/1995 |
| 2002/0122286 | A1 | 9/2002 | Anthony | JP | 07-240651 | 9/1995 |
| 2002/0131231 | A1 | 9/2002 | Anthony | JP | 08-124795 | 5/1996 |
| 2002/0149900 | A1 | 10/2002 | Anthony | JP | 08-163122 | 6/1996 |
| 2002/0158515 | A1 | 10/2002 | Anthony, Jr. et al. | JP | 08-172025 | 7/1996 |
| 2002/0186100 | A1 | 12/2002 | Anthony et al. | JP | 09-284077 | 10/1997 |
| 2003/0029632 | A1 | 2/2003 | Anthony, Jr. et al. | JP | 09-284078 | 10/1997 |
| 2003/0029635 | A1 | 2/2003 | Anthony, Jr. et al. | JP | 9-294041 | 11/1997 |
| 2003/0048029 | A1 | 3/2003 | DeDaran et al. | JP | 11-21456 | 8/1999 |
| 2003/0067730 | A1 | 4/2003 | Anthony et al. | JP | 11-214256 | 8/1999 |
| 2003/0161086 | A1 | 8/2003 | Anthony | JP | 11-223396 | 8/1999 |
| 2003/0202312 | A1 | 10/2003 | Anthony et al. | JP | 11-294908 | 10/1999 |
| 2003/0206388 | A9 | 11/2003 | Anthony et al. | JP | 11-305302 | 11/1999 |
| 2003/0210125 | A1 | 11/2003 | Anthony | JP | 11-319222 | 11/1999 |
| 2003/0231451 | A1 | 12/2003 | Anthony | JP | 11-345273 | 12/1999 |
| 2003/0231456 | A1 | 12/2003 | Anthony et al. | WO | WO 91/15046 | 10/1991 |
| 2004/0004802 | A1 | 1/2004 | Anthony et al. | WO | WO 97/43786 | 11/1997 |
| 2004/0008466 | A1 | 1/2004 | Anthony et al. | WO | WO 98/45921 | 10/1998 |
| 2004/0027771 | A1 | 2/2004 | Anthony | WO | WO 99/04457 | 1/1999 |
| 2004/0032304 | A1 | 2/2004 | Anthony et al. | WO | WO 99/19982 | 4/1999 |
| 2004/0054426 | A1 | 3/2004 | Anthony | WO | WO 99/37008 | 7/1999 |
| 2004/0085699 | A1 | 5/2004 | Anthony | WO | WO 99/52210 | 10/1999 |
| 2004/0105205 | A1 | 6/2004 | Anthony et al. | WO | WO 00/16446 | 3/2000 |
| 2004/0124949 | A1 | 7/2004 | Anthony et al. | WO | WO 00/74197 | 12/2000 |
| 2004/0130840 | A1 | 7/2004 | Anthony | WO | WO 00/77907 | 12/2000 |
| 2004/0218332 | A1 | 11/2004 | Anthony et al. | WO | 01/06631 | 1/2001 |
| 2004/0226733 | A1 | 11/2004 | Anthony et al. | WO | WO 01/10000 | 2/2001 |
| 2005/0016761 | A9 | 1/2005 | Anthony, Jr. et al. | WO | WO 01/41232 | 6/2001 |
| 2005/0018374 | A1 | 1/2005 | Anthony | WO | WO 01/41233 | 6/2001 |
| 2005/0063127 | A1 | 3/2005 | Anthony | WO | WO 01/45119 | 6/2001 |
| 2005/0248900 | A1 | 11/2005 | Anthony | WO | WO 01/71908 | 9/2001 |
| 2005/0286198 | A1 | 12/2005 | Anthony et al. | WO | WO 01/75916 | 10/2001 |
| 2006/0023385 | A9 | 2/2006 | Anthony et al. | WO | WO 01/84581 | 11/2001 |
| 2006/0139836 | A1 | 6/2006 | Anthony | WO | WO 01/86774 | 11/2001 |
| 2006/0139837 | A1 | 6/2006 | Anthony et al. | WO | WO 02/59401 | 1/2002 |
| 2006/0193051 | A1 | 8/2006 | Anthony et al. | WO | WO 02/11160 | 2/2002 |
| 2006/0203414 | A1* | 9/2006 | Anthony ............ 361/118 | WO | WO 02/15360 | 2/2002 |
| 2007/0019352 | A1 | 1/2007 | Anthony | WO | WO 02/33798 | 4/2002 |
| 2007/0047177 | A1 | 3/2007 | Anthony | WO | WO 02/127794 | 4/2002 |
| | | | | WO | WO 02/45233 | 6/2002 |
| | | FOREIGN PATENT DOCUMENTS | | WO | WO 02/65606 | 8/2002 |
| | | | | WO | WO 02/080330 | 10/2002 |
| DE | 198 57 043 A1 | | 3/2000 | WO | WO 00/65740 | 11/2002 |
| DE | 198 57 043 C1 | | 3/2000 | WO | WO 03/005541 | 1/2003 |
| EP | 0623363 | | 11/1994 | WO | WO 2004/070905 | 8/2004 |
| EP | 98915364 | | 11/1994 | WO | WO 2005/002018 | 1/2005 |
| EP | JP8172025 | | 7/1996 | WO | WO 2005/015719 | 2/2005 |
| EP | 0776016 | | 5/1997 | WO | WO 2005/065097 | 7/2005 |
| EP | 0933871 | | 8/1999 | WO | WO 2006/093830 | 9/2006 |
| EP | 1022751 | | 7/2000 | WO | WO 2006/093831 | 9/2006 |
| EP | 1024507 | | 8/2000 | WO | WO 2006/099297 | 9/2006 |
| EP | 1061535 | | 12/2000 | WO | WO 2006/104613 | 10/2006 |
| FR | 2765417 | | 12/1998 | | | |
| FR | 2808135 | | 10/2001 | | | |
| GB | 2217136 | | 4/1988 | | OTHER PUBLICATIONS | |
| GB | 2341980 | | 3/2000 | | | |
| JP | 63-269509 | | 11/1988 | PCT International Search Report for PCT/US01/44681, Jan. 2, 2003. | | |
| JP | 1-27251 | | 1/1989 | Greb, "An Intuitive Approach to EM Fields," EMC Test & Design, | | |
| JP | 02-267879 | | 11/1990 | Jan. 1, 1991, pp. 30-33. | | |
| JP | 03-018112 | | 1/1991 | Greb, "An Intuitive Approach to EM Coupling," EMC Test & Design, | | |
| JP | 5-283284 | | 10/1993 | Dec. 1, 1993, pp. 20-25. | | |
| JP | 05-299292 | | 11/1993 | Sakamoto, "Noiseproof Power Supplies: What's Important in EMI | | |
| JP | 06-053048 | | 2/1994 | Removal Filters?" JEE, Jun. 1, 1986, pp. 80-85. | | |

Montrose, "Analysis on Loop Area Trace Radiated Emissions from Decoupling Capacitor Placement on Printed Circuit Boards," IEEE, 1999, pp. 423-428, Jan. 1, 1999.

Miyoshi, "Surface Mounted Distributed Constant Type Noise Filter," IEEE, 1999, pp. 157-160, Jan. 1, 1999.

Shigeta et al., "Improved EMI Performance by Use of a Three-Terminal-Capacitor Applied to an IC Power Line," IEEE, 1999, pp. 161-164, Jan. 1, 1999.

PCT International Search Report for PCT/US99/07653, Jul. 19, 1999.

IPER for PCT/US99/07653, Oct. 13, 1999.

U.S. Appl. No. 10/479,506, Claims 1-46 from Preliminary Amendment, filed Dec. 10, 2003.

U.S. Appl. No. 10/189,339, Claims 1-41 from Preliminary Amendment, filed Oct. 28, 2003.

U.S. Appl. No. 10/443,792, Claims 1-41 from Preliminary Amendment, filed Oct. 28, 2003.

PCT International Search Report for PCT/US98/06962, Aug. 19, 1998.

PCT International Search Report for PCT/US99/01040, Apr. 19, 1999.

PCT International Search Report for PCT/US00/11409, Sep. 18, 2000.

PCT International Search Report for PCT/US00/14626, Sep. 13, 2000.

PCT International Search Report for PCT/US00/16518, Nov. 8, 2000.

PCT International Search Report for PCT/US00/21178, Dec. 28, 2000.

Fang et al., "Conductive Polymers Prolong Circuit Life," Design News, date unknown, 3 pages.

Carpenter, Jr. et al., "A New Approach to TVSS Design," Power Quality Assurance, Sep./Oct. 1996, p. 60-63, Sep. 1, 1996.

Raychem, "Polyswitch Resettable Fuses," Circuit Protection Databook, pp. 11-18, Jan. 1, 1996.

PCT International Search Report for PCT/US01/41720, Dec. 28, 2001.

PCT International Search Report for PCT/US01/09185, Jun. 13, 2001.

Polka et al., "Package-Level Interconnect Design for Optimum Electrical Performance," Intel Technology Journal Q3, pp. 1-17, Jul. 1, 2000.

PCT International Search Report for PCT/US01/43418, May 10, 2002.

PCT International Search Report for PCT/US01/32480, Mar. 13, 2002.

PCT International Search Report for PCT/US02/10302, Aug. 19, 2002.

PCT International Search Report for PCT/US02/21238, Feb. 28, 2003.

PCT International Search Report for PCT/US01/13911, Mar. 18, 2002.

PCT International Search Report for PCT/US91/02150, Jul. 16, 1991.

PCT International Search Report for PCT/US01/03792, Jun. 28, 2001.

"Johanson Dielectrics, Inc. Licenses X2Y Circuit Conditioning Technology," Press Release, Dec. 16, 1998, 1 page.

Beyne et al., "PSGA—an innovative IC package for single and multichip designs," Components, pp. 6-9, Mar. 1, 1997.

"EMC Design for Brush Commutated DC Electric Motors," Sep. 15, 1997, pp. 1-2.

"Tomorrow's Capacitors," Components, 1996, No. 4, p. 3, Apr. 1, 1996.

Mason, "Valor—Understanding Common Mode Noise," Mar. 30, 1998, pp. 1-7.

Anthony Anthony et al., Pending specification, claims, figures for U.S. Appl. No. 10/237,079, Claims 21-81; filed Sep. 9, 2002.

David Anthony et al., Pending specification, claims, figures for U.S. Appl. No. 10/766,000, Claims 1-63; filed Jan. 29, 2004.

William Anthony, Pending specification, claims, figures for U.S. Appl. No. 10/399,630, Claims 1-35; filed Aug. 27, 2003.

Anthony Anthony et al., Pending specification, claims, figures for U.S. Appl. No. 10/432,840, Claims 1-39; filed May 28, 2003.

William Anthony, Pending specification, claims, figures for U.S. Appl. No. 10/443,482, Claims 1-25; filed Jun. 12, 2003.

Anthony Anthony et al., Pending specification, claims, figures for U.S. Appl. No. 10/435,199, Claims 1-32; filed May 12, 2003.

Anthony Anthony et al., Pending specification, claims, figures for U.S. Appl. No. 10/115,159, Claims 1-31; filed Apr. 2, 2002.

Anthony Anthony et al., Pending specification, claims, figures for U.S. Appl. No. 10/189,338, Claims 1-69; filed Jul. 2, 2002.

Anthony Anthony et al., Pending specification, claims, figures for U.S. Appl. No. 10/189,339, Claims 1-41; filed Jul. 2, 2002.

Anthony Anthony et al., Pending specification, claims, figures for U.S. Appl. No. 10/479,506, Claims 1-46; filed Dec. 10, 2003.

Anthony Anthony, Pending specification, claims, figures for U.S. Appl. No. 10/443,764, Claims 26-40; filed Sep. 16, 2003.

Anthony Anthony, Pending specification, claims, figures for U.S. Appl. No. 10/443,792, Claims 1-41; May 23, 2003.

Anthony Anthony, Pending specification, claims, figures for U.S. Appl. No. 10/443,788, Claims 1; 21-45; filed May 23, 2003.

Anthony Anthony et al., Pending specification, claims, figures for U.S. Appl. No. 10/443,778, Claims 1; 21-59; filed May 23, 2003.

Anthony Anthony et al., Pending specification, claims, figures for U.S. Appl. No. 10/460,361, Claims 1-16; filed Jun. 13, 2003.

Anthony Anthony et al., Pending specification, claims, figures for U.S. Appl. No. 10/705,962, Claims 19-33; filed May 25, 2005.

Anthony Anthony, Pending specification, claims, figures for U.S. Appl. No. 10/369,335, Claims 1-20; Feb. 18, 2003.

Anthony Anthony et al., Pending specification, claims, figures for U.S. Appl. No. 09/647,648, Claims 1-48; filed Nov. 17, 2000.

Anthony Anthony, Pending specification, claims, figures for U.S. Appl. No. 10/328,942, Claims 1-20; filed Dec. 23, 2002.

Anthony Anthony et al., Pending specification, claims, figures for U.S. Appl. No. 09/632,048, Claims 1-20; filed Aug. 3, 2000.

Anthony Anthony et al., Pending specification, claims, figures for U.S. Appl. No. 09/996,355, Claims 1-73; filed Nov. 29, 2001.

William Anthony, Pending specification, claims, figures for U.S. Appl. No. 10/023,467, Claims 1-20; filed Dec. 17, 2001.

Weir, et al., "DesignCon 2005, High Performance FPGA Bypass Networks", Jan. 1, 2005.

Pending claims 1-40 and figures (3 pages) for U.S. Appl. No. 10/399,590; the specification is contained in WO 02/33798, filed Oct. 17, 2001, which is the published version of PCT/US01/32480, which is Neifeld Reference: X2YA0015UPCT-US, which is reference F-063 in the Information Disclosure Statement filed Apr. 23, 2004, Apr. 25, 2002.

PCT International Search Report for PCT/US04/00218, Feb. 11, 2005.

PCT International Search Report for PCT/US04/14539, Feb. 18, 2005.

Australian Patent Office Examination Report for SG 200303041-8; Neifeld Ref: X2YA0025UPCT-SG, Mar. 24, 2005.

PCT International Search Report for PCT/US04/18938, Apr. 11, 2005.

Muccioli, "EMC Society Seattle and Oregon Chapters—New X2Y Filter Technology Emerges as Singles Component Solution for Noise Suppression", Nov. 2000.

PCT Corrected IPER for PCT/US04/00218, Sep. 27, 2005.

Supplementary Partial European Search Report EP 99916477, Nov. 8, 2005.

Supplementary European Search Report EP 98915364, Oct. 27, 2005.

PCT ISR for PCT/US04/39777, Dec. 9, 2005.

EP Examination Report for 99916477.5-2215, May 8, 2006.

PCT Written Opinion of the International Search Authority, PCT/US2007/063463.

PCT International Search Report, PCT/US2007/063463.

* cited by examiner

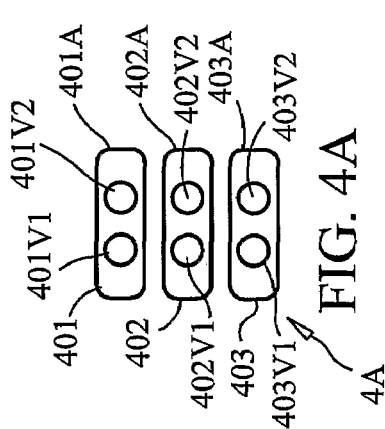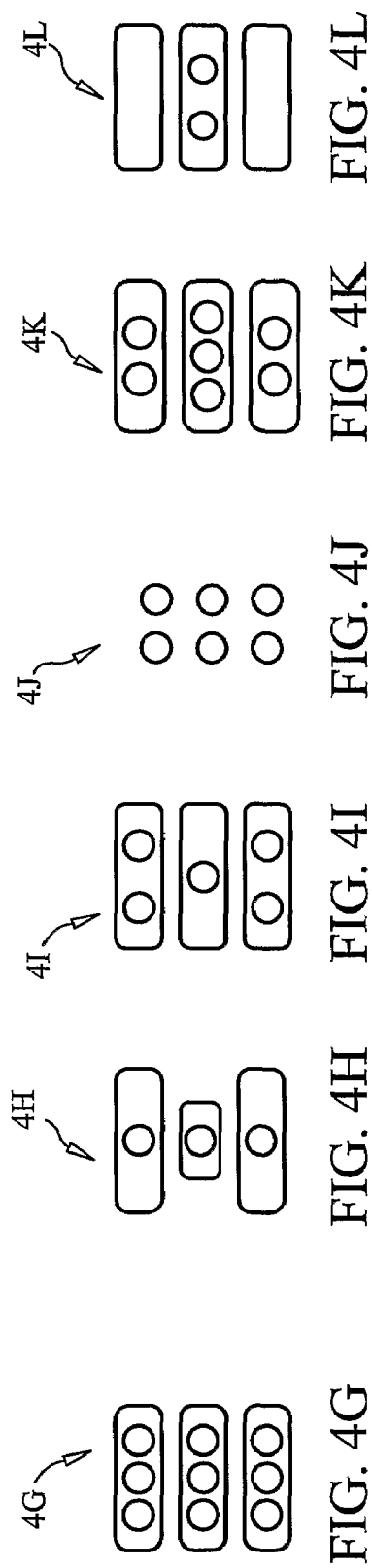

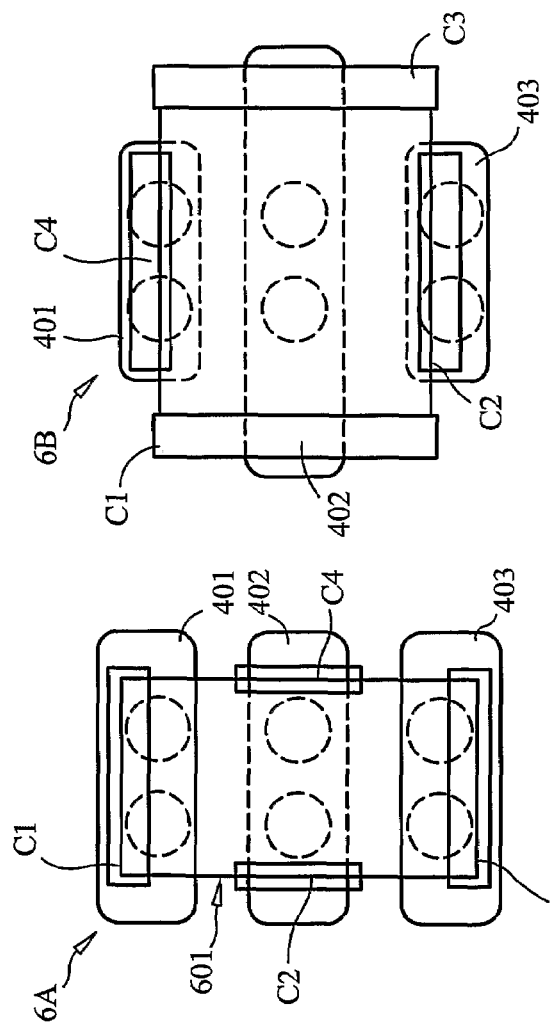

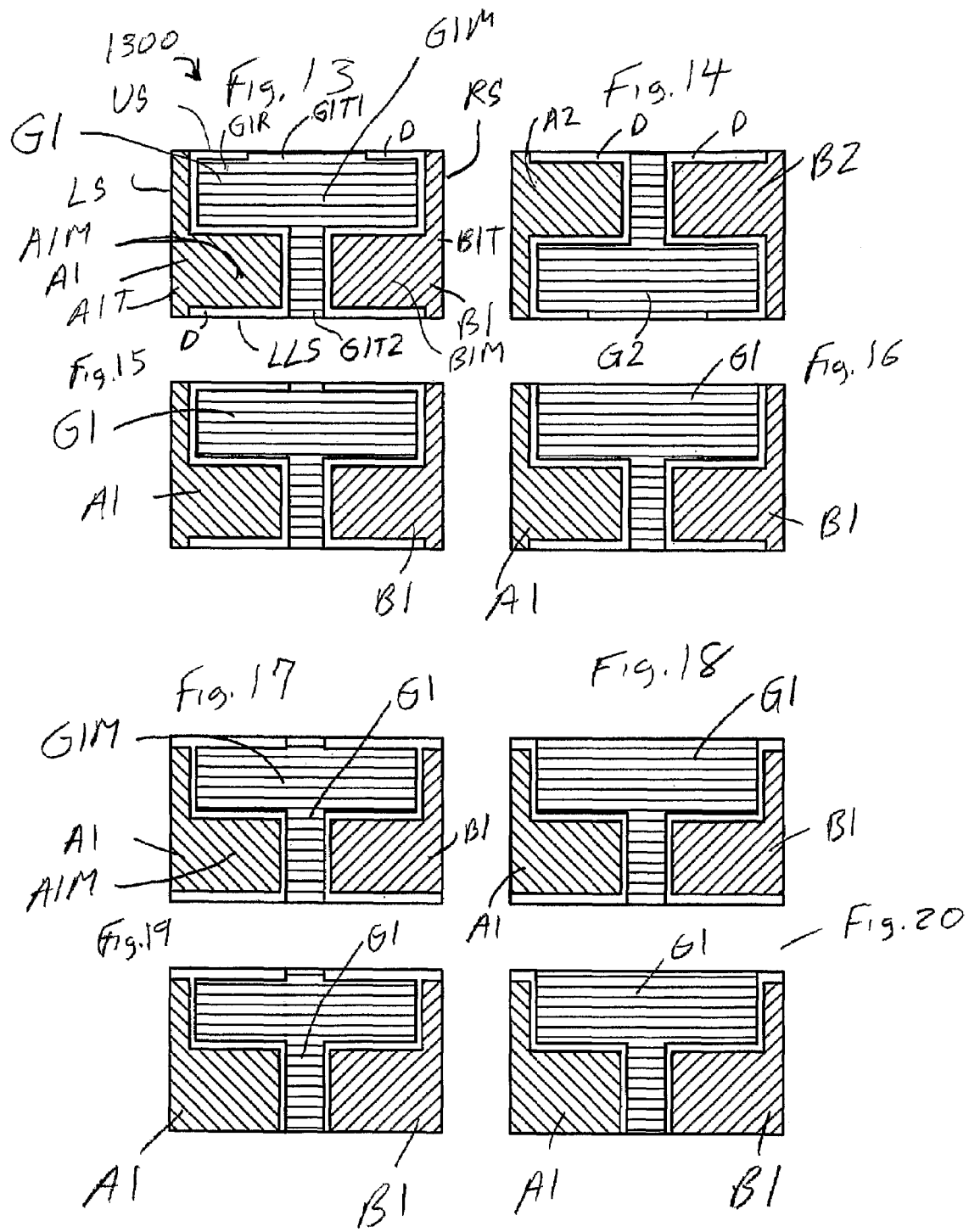

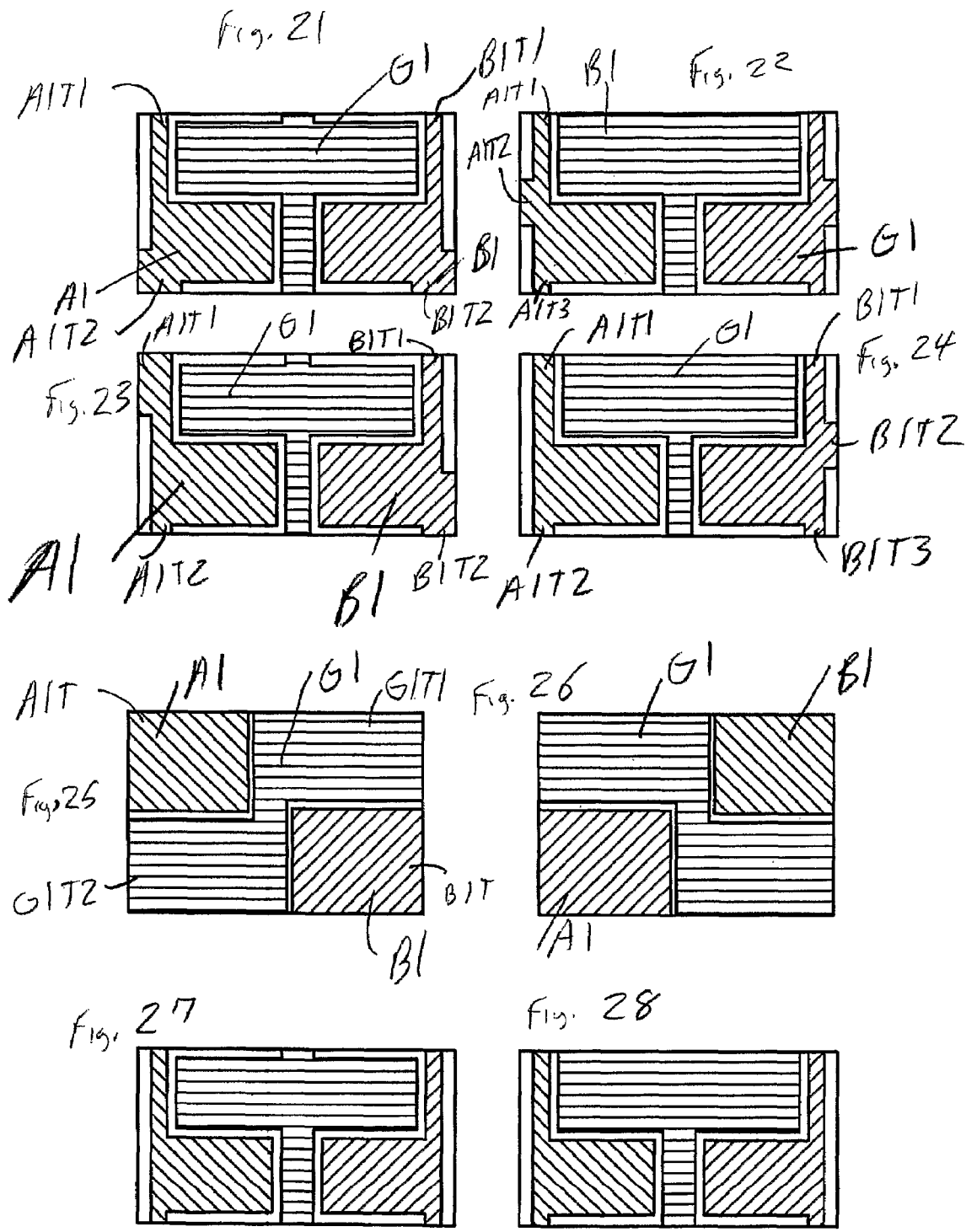

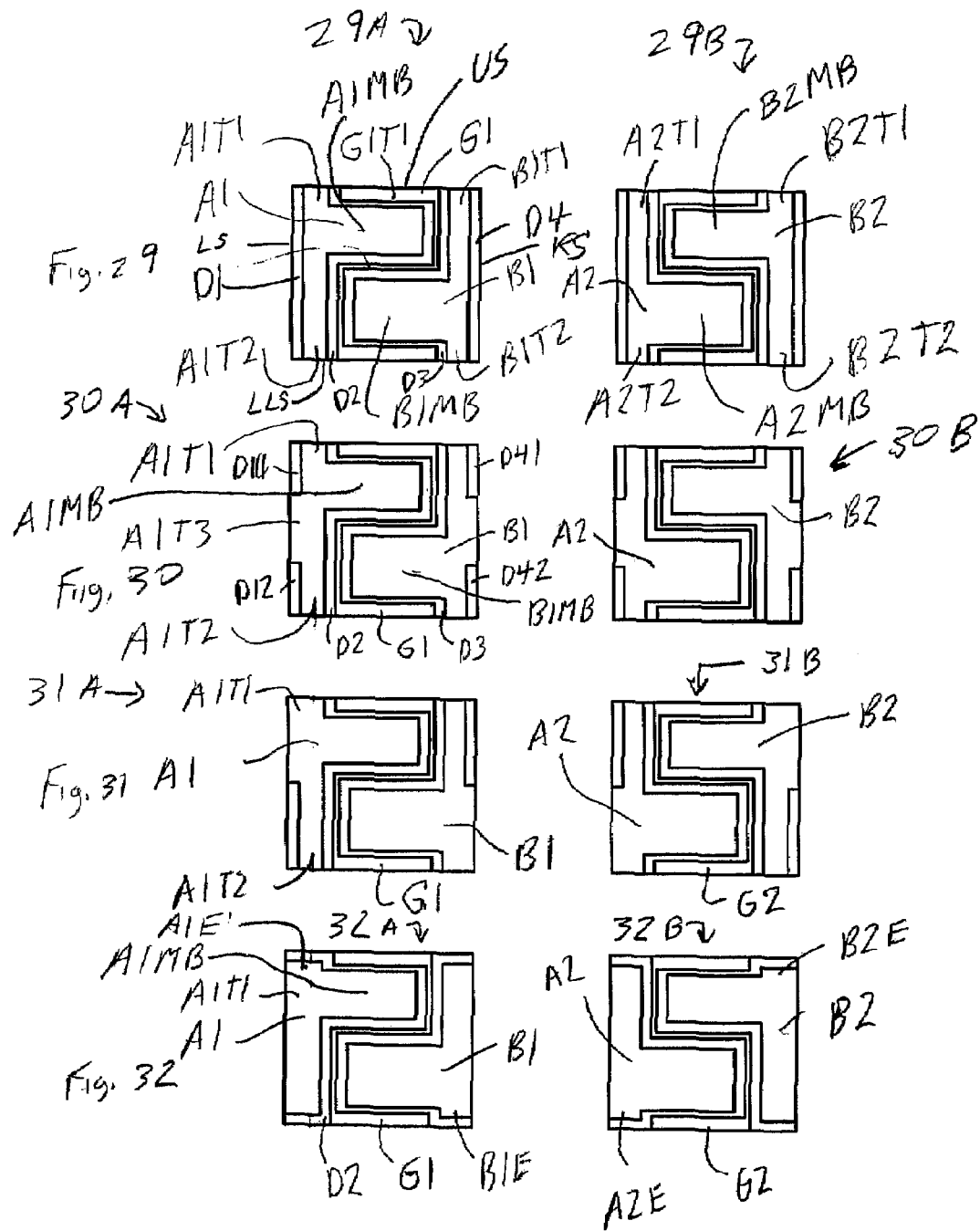

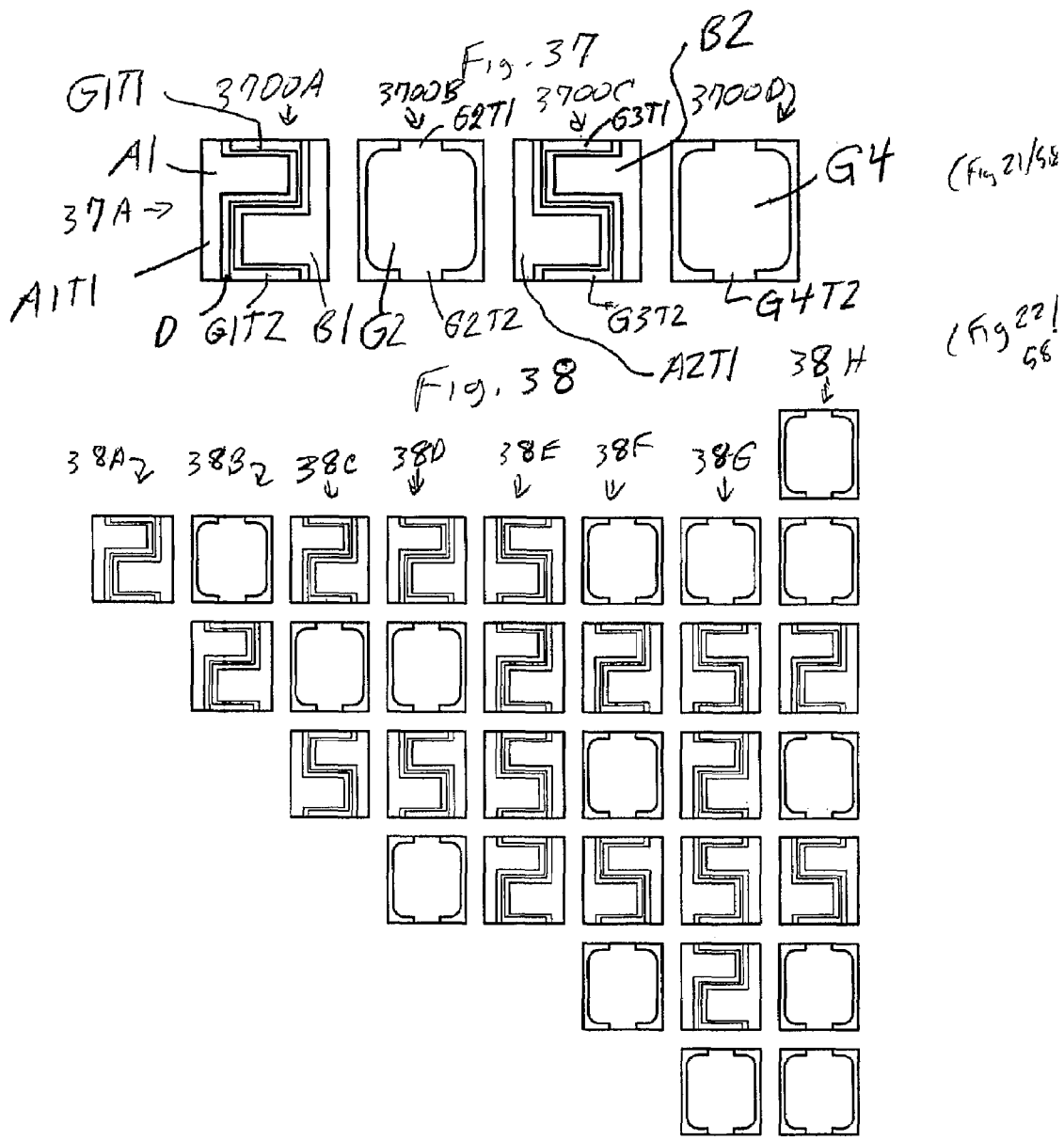

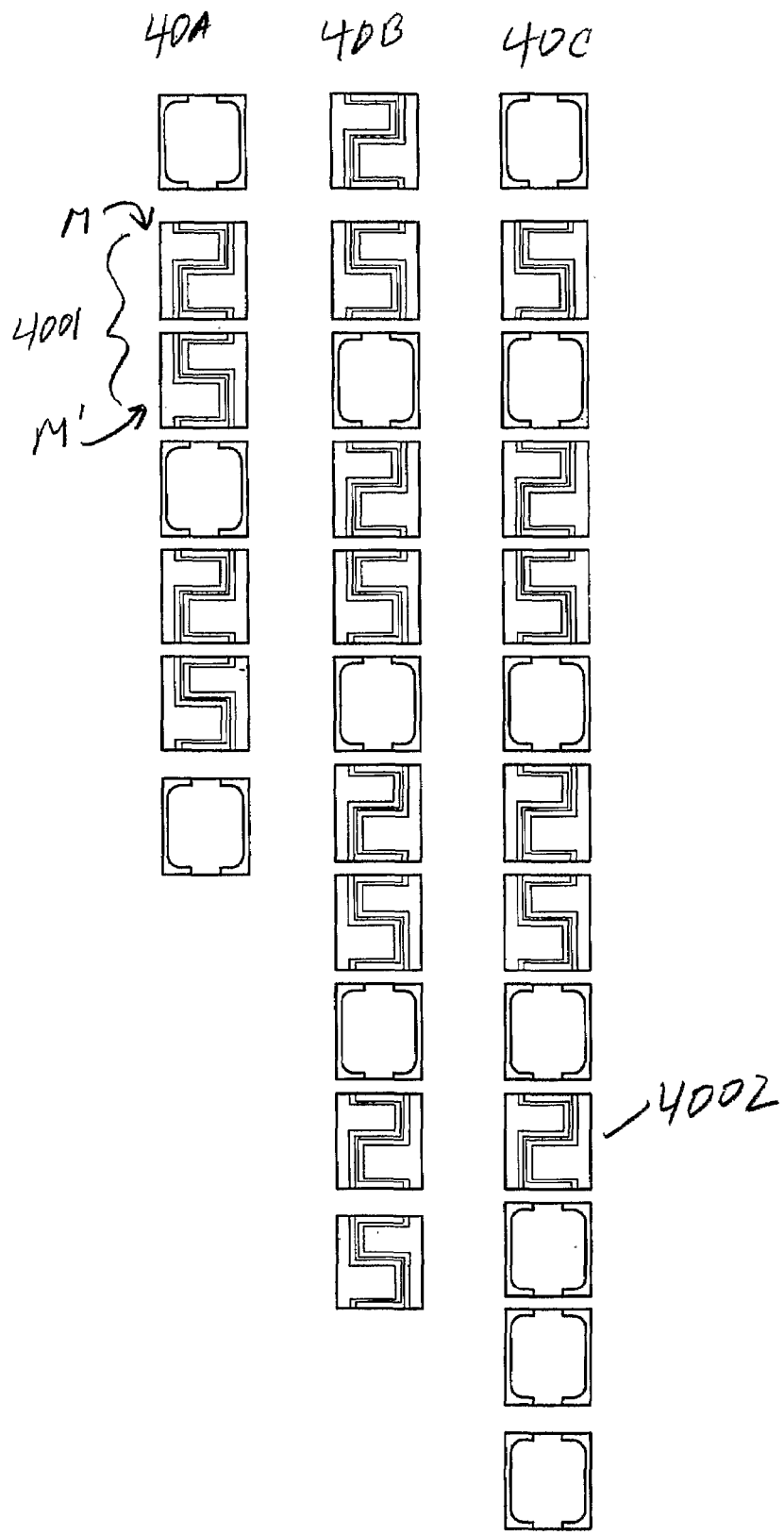

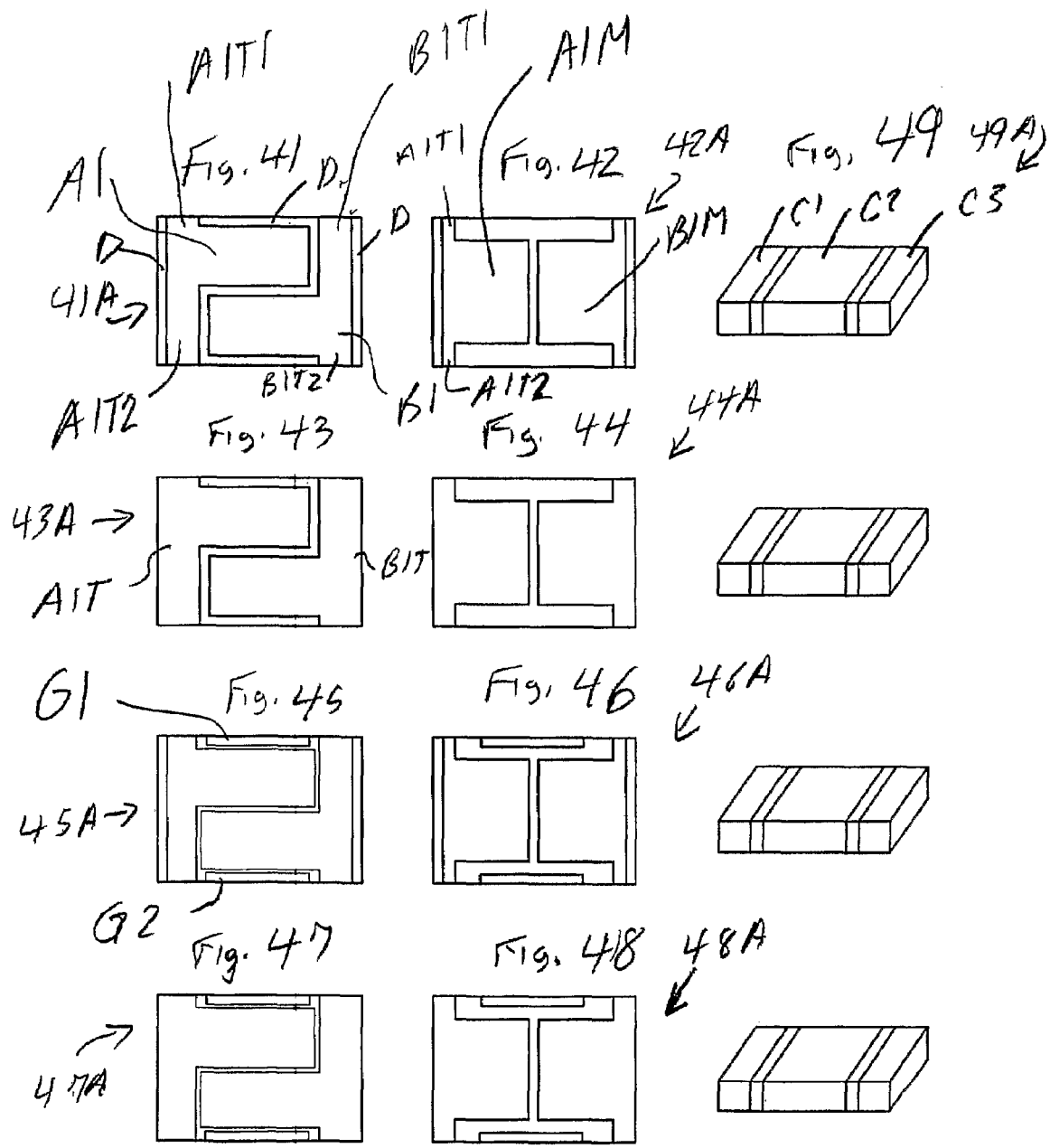

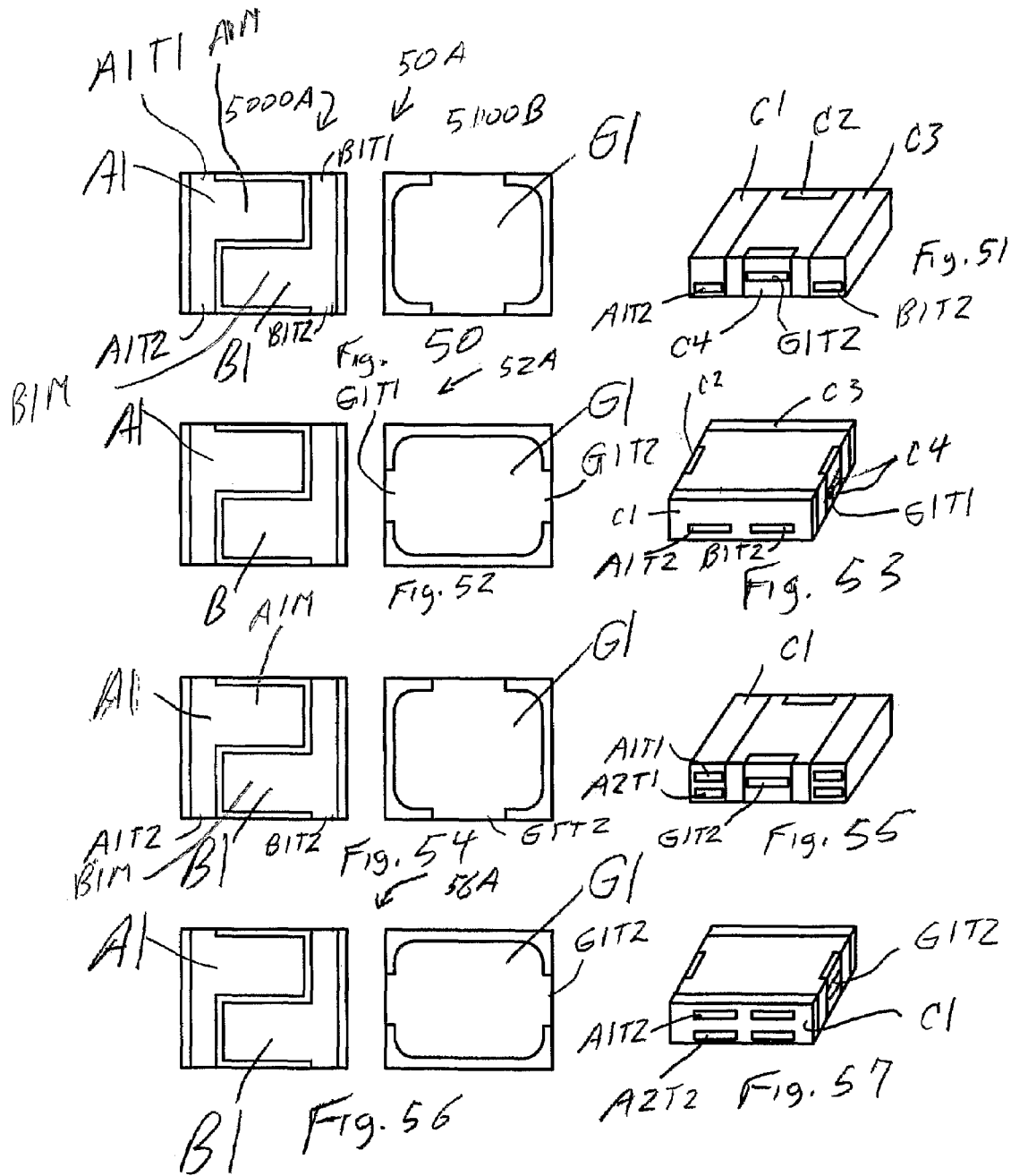

CONDITIONER WITH COPLANAR CONDUCTORS

CROSS REFERENCE TO RELATED APPLICATIONS

This application is a U.S. national stage entry of international application PCT/US06/06609 filed Feb. 27, 2006, which claims priority to U.S. provisional application No. 60/656,910, filed Mar. 1, 2005, and claims priority to U.S. provisional application No. 60/661,002, filed Mar. 14, 2005, and claims priority to U.S. provisional application No. 60/668,992, filed Apr. 7, 2005, and claims priority to U.S. provisional application No. 60/671,107, filed Apr. 14, 2005, and claims priority to U.S. provisional application No. 60/671,532, filed Apr. 15, 2005, and claims priority to U.S. provisional application No. 60/674,284, filed Apr. 25, 2005, and claims priority to U.S. provisional application No. 60/751,273, filed Dec. 19, 2005.

The disclosures of all of the foregoing applications are incorporated herein by reference.

FIELD OF THE INVENTION

This invention relates to energy conditioning.

BACKGROUND OF THE INVENTION

Electrical circuits using low frequency electrical power generate noise that is coupled through the power distribution system. That noise is generally detrimental. In the past, capacitors have been used to condition the electrical power propagating to and from devices. One type of device in which capacitors have been used to condition electrical power is an active circuitry. Capacitors have been used to in active circuitry to decouple noise from the power lines. Typically, in applications involving Large or Very Large Scale Integration (LSI or VLSI) Integrated Circuits (ICs), multiple rows of capacitors are arrayed on a PC board as close as feasible to the location of the IC in the PC board, given design constraints. This arrangement provides sufficient decoupling of the power and ground from the IC's active circuitry. The terms "bypass" and "decoupling" are used interchangeable herein.

SUMMARY OF THE INVENTION

This application discloses novel energy conditioner structures and novel combinations of the connections of the energy conditioners on other structures, such as PC board structures, and novel circuit arrangements of the energy conditioners with structures, such as PC boards, described herein, generally provide improved decoupling, per conditioner, and require less conditioners and related structure, such as vias, to provide sufficient decoupling. Similarly to PC boards, the structures to which the novel conditioners and the novel combination of the connections of the energy conditioners may be applied include first level interconnects and semiconductor chips, including for example ASIC, FPGA, CPU, memory, transceiver, computer on a chip, and the like.

More particularly, this application discloses and claims energy conditioner internal structures and external structures, connection structure, and circuits including energy conditioners having A, B, and G master electrodes.

Energy conditioner internal structures disclosed herein contain either three conductive layers in the same plane or two conductive layers in a first plane and a third conductive layer in a second plane.

In one aspect, the claims define an energy conditioner internal structure and methods of making and using it wherein the internal structure has a left side surface, a right side surface, an upper side surface, a lower side surface, a top side surface, and a bottom side surface; wherein said internal structure comprises a dielectric material and a conductive material; wherein surfaces of said dielectric material and surfaces of said conductive material define said left side surface, said right side surface, said upper side surface, said lower side surface, said top side surface, and said bottom side surface; wherein said conductive material comprises a first A conductive layer, a first B conductive layer, and a first G conductive layer in a first plane; wherein said first A conductive layer, said first B conductive layer, and said first G conductive layer are electrically isolated from one another in said internal structure; wherein said first A conductive layer comprises at least one first A conductive layer first tab and a first A conductive layer main body portion; wherein said first B conductive comprises at least one first B conductive layer first tab and a first B conductive layer main body portion; wherein said first G conductive layer comprises at least a first G conductive layer first tab, a first G conductive layer second tab, and a first G conductive layer main body portion; wherein said first A conductive layer main body portion does not extend to any one of said left side surface, said right side surface, said upper side surface, and said lower side surface; wherein said first B conductive layer main body portion does not extend to any one of said left side surface, said right side surface, said upper side surface, and said lower side surface; wherein said first G conductive layer main body portion does not extend to any one of said left side surface, said right side surface, said upper side surface, and said lower side surface; and wherein said first G conductive layer is between said A conductive layer and said B conductive layer.

In dependent aspects, the claim define an energy conditioner comprising the structure of claim 1 and an energy conditioner external structure; an assembly comprising the energy conditioner mounted on mounting surface structure, wherein said mounting surface structure consists of a first conductive region, a second conductive region, and a third conductive region; wherein said first A conductive layer conductively connects to said first conductive region; wherein said first B conductive layer conductively connects to said second conductive region; and wherein said G conductive layer conductively connects to said third conductive region; the assembly wherein said external conductive structure comprises a first conductive integration structure, a second conductive integration structure, and a third conductive integration structure; wherein said first conductive integration structure contacts said first A conductive layer first tab and said first conductive region; wherein said second conductive integration structure contacts said first B conductive layer first tab and said second conductive region; wherein said third conductive integration structure contacts said first G conductive layer first tab and said third conductive region; the assembly wherein said first conductive integration structure resides on a at least said left side surface, said second conductive integration structure resides on at least said right side surface, and said third conductive integration structure resides between said first conductive integration structure and said second conductive integration structure; the assembly further comprising a fourth conductive integration structure that contacts said first G conductive layer second tab and said third conductive region; the assembly wherein said third conductive integration structure also contacts said first G conductive layer second tab and said third conductive region.

In additional dependent aspects, the claims define the internal structure wherein said first G conductive layer main body portion extends in a region near said upper side surface; wherein said first A conductive layer main body portion extends, in a region closer to said lower side surface than said upper side surface, from said first A conductive layer first tab towards said left side surface, such that a portion of said first G conductive layer main body portion is between a portion of said first A conductive layer main body portion and said upper side surface; and wherein said first B conductive layer main body portion extends, in a region closer to said lower side surface than said upper side surface, from said first B conductive layer first tab towards said right side surface, such that a portion of said first G conductive layer main body portion is between a portion of said first B conductive layer main body portion and said upper side surface; wherein said first G conductive layer first tab extends to said upper side surface; wherein said a first G conductive layer main body portion extends, in a region closer to said upper side surface than said lower side surface, further towards said left side surface than said first G conductive layer first tab; and wherein said a first G conductive layer main body portion extends, in a region closer to said upper side surface than said lower side surface, further towards said right side surface than said first G conductive layer first tab; the internal structure wherein said first A conductive layer first tab extends to at least one of said left side surface, said upper side surface, and said bottom side surface; the internal structure wherein said first A conductive layer first tab extends to all of said left side surface, a portion of said upper side surface at the intersection of said upper side surface and said left side surface, and a portion of said lower side surface at the intersection of said lower side surface and said left side surface; the internal structure wherein said first A conductive layer first tab extends to only said left side surface; the internal structure wherein said at least one first A conductive layer first tab consists of said first A conductive layer first tab and a first A conductive layer second tab; wherein said first A conductive layer first tab extends to only said upper side surface; and wherein said first A conductive layer second tab extends only to said lower side surface; the internal structure wherein said at least one first A conductive layer first tab consists of said first A conductive layer first tab and a first A conductive layer second tab; wherein said first A conductive layer first tab extends to only said upper side surface; and wherein said first A conductive layer second tab extends only to a region at a corner of said lower side surface and said left side surface; the internal structure wherein said at least one first A conductive layer first tab consists of said first A conductive layer first tab, a first A conductive layer second tab, and a first A conductive layer third tab; wherein said first A conductive layer first tab extends to only said upper side surface; wherein said first A conductive layer second tab extends only to said left side surface; and wherein said first A conductive layer third tab extends only to said lower side surface; the internal structure wherein said A conductive layer and said B conductive layer are mirror images of one another about a line extending from a center of said upper side surface to a center of said lower side surface; the internal structure wherein said first A conductive layer first tab extends to a region at a corner of said lower side surface and said left side surface; wherein said first B conductive layer first tab extends to a region at a corner of said upper side surface and said right side surface; wherein said first G conductive layer first tab extends to a region at a corner of said upper side surface and said left side surface; and wherein said first G conductive layer second tab extends to a region at a corner of said lower side surface and said right side surface;

the internal structure wherein said G conductor main body portion has a G conductor main body portion area, said A conductor main body portion has an A conductor main body portion area, and said G conductor main body portion area is larger than said A conductor main body portion area; the internal structure further comprising a second G conductive layer in a second plane; wherein said second G conductive layer comprises at least a second G conductive layer first tab, a second G conductive layer second tab, and a second G conductive main body portion; and wherein said first G conductive layer and said second G conductive layer are stacked such that (1) said first G conductive layer first tab and said second G conductive layer first tab overlap and (2) said first G conductive layer second tab and said second G conductive layer second tab overlap; the internal structure wherein said second G conductive layer includes no tabs other than said second G conductive layer first tab and said second G conductive layer second tab, and wherein said second G conductive layer occupies a majority of the area between said left side, said right side surface, said upper side surface, and said lower side surface; the internal structure wherein said first A conductive layer, said first B conductive layer, and said first G conductive layer form a first pattern; further comprising a second A conductive layer, a second B conductive layer, and a second G conductive layer that form a second pattern in a second plane; the internal structure wherein said second pattern is different from said first pattern; the internal structure wherein said second pattern is identical to said first pattern, and said second pattern is aligned with no rotation compared to said first pattern, forming a first no rotation aligned pair; the internal structure wherein said second pattern is identical to said first pattern, and said second pattern is aligned with 180 degrees of rotation compared to said first pattern, forming a first anti-aligned pair; the internal structure further comprising a second no rotation aligned pair each having said first pattern; the internal structure further comprising a second G conductive layer between said first no rotation aligned pair and said second no rotation aligned pair; the internal structure further comprising a second anti-aligned pair each having said first pattern; and the internal structure further comprising a second G conductive layer between said first anti-aligned pair and said second anti-aligned pair.

In another aspect, the claims define an energy conditioner comprising internal structure; and an external structure; wherein said internal structure has a left side surface, a right side surface, an upper side surface, a lower side surface, a top side surface, and a bottom side surface; wherein said internal structure comprises a dielectric material and a conductive material; wherein surfaces of said dielectric material and surfaces of said conductive material define said left side surface, said right side surface, said upper side surface, said lower side surface, said top side surface, and said bottom side surface; wherein said conductive material comprises a first A conductive layer and a first B conductive layer in a first plane, and a first G conductive layer in a second plane, said second plane above said first plane; wherein said first A conductive layer, said first B conductive layer, and said first G conductive layer are electrically isolated from one another in said internal structure; wherein said first A conductive layer comprises at least one first A conductive layer first tab, a first A conductive layer second tab, and a first A conductive layer main body portion; wherein said first B conductive comprises at least one first B conductive layer first tab, a first A conductive layer second tab, and a first B conductive layer main body portion; wherein said first G conductive layer comprises at least a first G conductive layer first tab, a first G conductive layer second tab, and a first G conductive layer main body portion; wherein said first A conductive layer first tab extends to said upper side surface near said left side surface; wherein said first A conductive layer second tab extends to said lower side surface near said left side surface; wherein said first A conductive layer main body portion extends in a region closer to said right side surface than said left side surface and closer to said upper side surface than said lower side surface; wherein said first B conductive layer first tab extends to said upper side surface near said right side surface; wherein said first B conductive layer second tab extends to said lower side surface near said right side surface; wherein said first B conductive layer main body portion extends in a region closer to said left side surface than said right side surface and closer to said lower side surface than said upper side surface; said external structure comprises a first conductive integration structure, a second conductive integration structure, a third conductive integration structure, and a fourth conductive integration structure; wherein first conductive integration structure contacts to said first A conductive layer first tab and said first A conductive layer second tab; wherein second conductive integration structure contacts to said first B conductive layer first tab and said first B conductive layer second tab; wherein third conductive integration structure contacts to said first G conductive layer first tab; and wherein fourth conductive integration structure contacts to said first G conductive layer second tab.

In dependent aspects to the foregoing, the claims define conditioner wherein said third conductive integration structure and said fourth conductive integration structure for a band on the outer surface of said energy conditioner; the conditioner wherein said first G conductive layer first tab extends to said lower side surface and said first G conductive layer second tab extends to said upper side surface; the conditioner wherein said first G conductive layer first tab extends to said left side surface and said first G conductive layer second tab extends to said right side surface the conditioner wherein said conductive material comprises a second A conductive layer and a second B conductive layer in a third plane, said third plane above said first plane; wherein said second A conductive layer comprises a second A conductive layer first tab and a second A conductive layer second tab; and wherein said second B conductive layer comprises a second B conductive layer first tab and a second B conductive layer second tab; the conditioner wherein said second A conductive layer first tab overlaps with said first A conductive layer first tab; and wherein said second B conductive layer first tab overlaps with said first B conductive layer first tab.

BRIEF DESCRIPTION OF THE DRAWINGS

The figures show elements of embodiments of the inventions. The same reference number in different figures refers to identical elements or elements with similar structure or function.

FIG. 6A is a schematic view showing a novel combination of a novel energy conditioner on an arrangement of mounting surface structure elements including conductive pads and vias, with two vias per pad;

FIG. 6B is a schematic view showing a novel combination of a novel energy conditioner on an arrangement of mounting surface structure elements including conductive pads and vias, with two vias per pad, and a central pad that extends further than the outer two pads such that the central pad contacts conductive terminals, caps, or bands on left and right hand sides of the energy conditioner;

FIG. 6C is a top plan view showing a novel combination of a novel energy conditioner on an arrangement of mounting surface structure elements including conductive pads and vias showing overlap of terminals of the conditioner with vias;

FIG. 13 is a plan view of a plate of a minimum one plate build for an energy conditioner;

FIG. 14 is a plan view of a plate of a minimum one plate build for an energy conditioner;

FIG. 15 is a plan view of a plate of a minimum one plate build for an energy conditioner;

FIG. 16 is a plan view of a plate of a minimum one plate build for an energy conditioner;

FIG. 17 is a plan view of a plate of a minimum one plate build for an energy conditioner;

FIG. 18 is a plan view of a plate of a minimum one plate build for an energy conditioner;

FIG. 19 is a plan view of a plate of a minimum one plate build for an energy conditioner;

FIG. 20 is a plan view of a plate of a minimum one plate build for an energy conditioner;

FIG. 21 is a plan view of a plate of a minimum one plate build for an energy conditioner;

FIG. 22 is a plan view of a plate of a minimum one plate build for an energy conditioner;

FIG. 23 is a plan view of a plate of a minimum one plate build for an energy conditioner;

FIG. 24 is a plan view of a plate of a minimum one plate build for an energy conditioner;

FIG. 25 is a plan view of a plate of a minimum one plate build for an energy conditioner;

FIG. 26 is a plan view of a plate of a minimum one plate build for an energy conditioner;

FIG. 27 is a plan view of a plate of a minimum one plate build for an energy conditioner;

FIG. 28 is a plan view of a plate of a minimum one plate build for an energy conditioner;

FIG. 29 is an exploded view of a stack of two plates of an energy conditioner in which the plates are also displaced in the plane of the paper;

FIG. 30 is an exploded view of a stack of two plates of an energy conditioner in which the plates are also displaced in the plane of the paper;

FIG. 31 is an exploded view of a stack of two plates of an energy conditioner in which the plates are also displaced in the plane of the paper;

FIG. 32 is an exploded view of a stack of two plates of an energy conditioner in which the plates are also displaced in the plane of the paper;

FIG. 37 is an exploded view of a stack of four plates of an energy conditioner in which the plates are also displaced in the plane of the paper;

FIG. 38 is a set of exploded views of stacks 38A-38H of plates of energy conditioners in which the plates in each stack are also displaced in the plane of the paper;

FIG. 40 is a set of exploded views of stacks 40A-40C of plates of energy conditioners in which the plates in each stack are displaced in the plane of the paper;

FIG. 41 is a plan view of a plate of a minimum one plate build of an energy conditioner having external structure shown in FIG. 49;

FIG. 42 is a plan view of a plate of a minimum one plate build of an energy conditioner having external structure shown in FIG. 49;

FIG. 43 is a plan view of a plate of a minimum one plate build of an energy conditioner having external structure shown in FIG. 49;

FIG. 44 is a plan view of a plate of a minimum one plate build of an energy conditioner having external structure shown in FIG. 49;

FIG. 45 is a plan view of a plate of a minimum one plate build of an energy conditioner having external structure shown in FIG. 49;

FIG. 46 is a plan view of a plate of a minimum one plate build of an energy conditioner having external structure shown in FIG. 49;

FIG. 47 is a plan view of a plate of a minimum one plate build of an energy conditioner having external structure shown in FIG. 49;

FIG. 48 is a plan view of a plate of a minimum one plate build of an energy conditioner having external structure shown in FIG. 49;

FIG. 49 is a perspective view showing one configuration of external structure of an energy conditioner for internal structures shown in FIGS. 41-48;

FIG. 50 is an exploded view of a set of two plates of a novel energy conditioner in which the plates have been displaced vertically in the page;

FIG. 51 is a perspective view of an exterior surface of a novel energy conditioner including the stack of two plates shown in FIG. 50;

FIG. 52 is an exploded view of a set of two plates of a novel energy conditioner in which the plates have been displaced vertically in the page;

FIG. 53 is a perspective view of an exterior surface of a novel energy conditioner including the stack of two plates shown in FIG. 52;

FIG. 54 is an exploded view of a set of two plates of a novel energy conditioner in which the plates have been displaced vertically in the page;

FIG. 55 is a perspective view of an exterior surface of a novel energy conditioner including the stack of two plates shown in FIG. 54;

FIG. 56 is an exploded view of a set of two plates of a novel energy conditioner in which the plates have been displaced vertically in the page;

FIG. 57 is a perspective view of an exterior surface of a novel energy conditioner including the stack of two plates shown in FIG. 56; and

DETAILED DESCRIPTION OF THE EMBODIMENTS

Figure 1A:
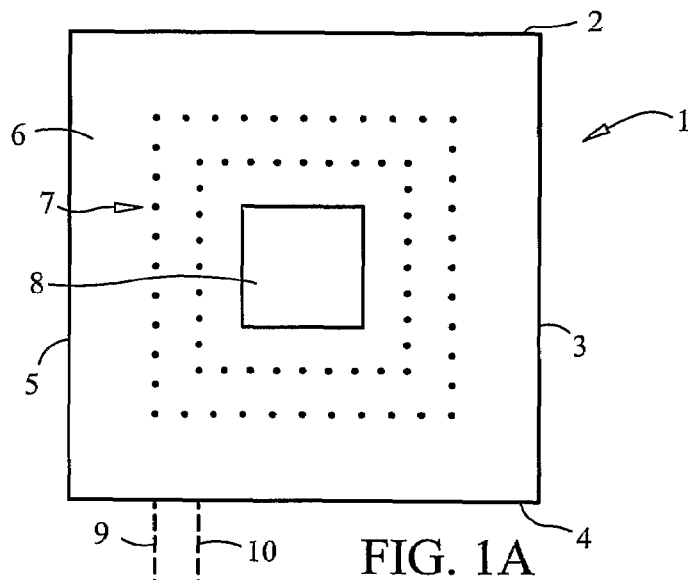
FIG. 1A is a plan view of a conventional digital circuit board, also called a PC board, for a conventional high speed VLSI IC (Very Large Scale Integration Integrated Circuit) chip.

FIG. 1A shows PC board 1 having sides 2, 3, 4, and 5, top surface 6, array 7 of structure for mounting discrete capacitors, and region 8 for mounting an IC. Each side of array 7 defines plural rows, such as rows 9 and 10. Each element or array 7 represents mounting structure for mounting a discrete capacitor. Conventional PC boards often have an array including at least two rows of structure for mounting capacitors. Each row may have several to tens of array elements for mounting capacitors. The board is designed so that capacitors mounted to the elements of array 7 sufficiently decouple the power to the IC from active circuitry so that the IC and any other coupled circuit elements functions as intended.

Conventional capacitors are two terminal discrete devices.

Figure 1B:
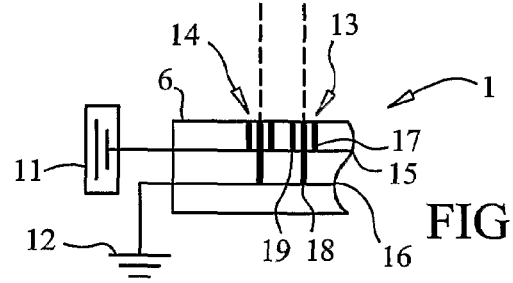
FIG. 1B is schematic partial edge side sectional view of the conventional board of FIG. 1A.

FIG. 1B shows a portion of board 1, a source of electrical power 11, a ground 12, mounting structure 13 corresponding to one element of array 7, mounting structure 14 corresponding to another element of array 7, power plane 15, and ground plane 16. In addition, FIG. 1B shows three vias extend down from each mounting structure element, such as vias 17, 18, 19 below mounting structure 13. Use of more than two vias enables mounting unconventional devices, such as 3 terminal energy conditioners.

In operation, power source 11 distributes electrical power to circuit elements mounted to board 1 via conductive connection of power source 11 to power plane 15. Ground plane 16 conductively connects to ground 12. Vias 17 and 19 conductively connect to power plane 15. Via 18 does not conductively connect to power plane 15 and instead passes through an aperture in power plane 15 to ground plane 16. Power plane 15 is above ground plane 16.

Figure 2A:
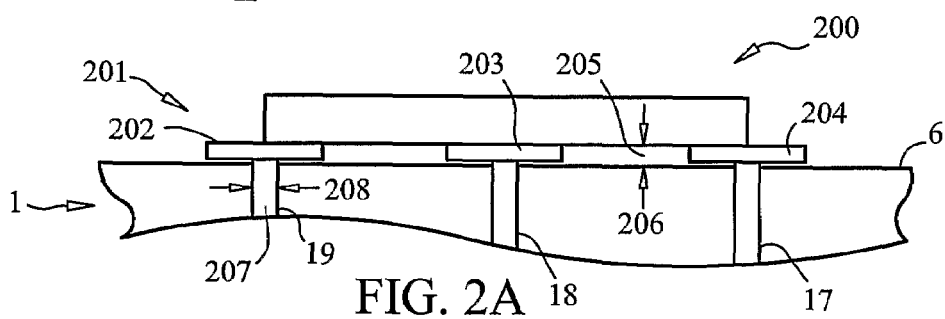
FIG. 2A is a partial side sectional view of a structure including a more than two terminal energy conditioner mounted via pads to a board, showing vias connecting the conditioner and conductive planes in the board.

FIG. 2A shows assembly 200 including energy conditioner 201 mounted on board 1. Board 1 includes pads 202, 203, 204 that separate conditioner 201 from board surface 6 by a distance 205 as indicated by the distance between facing arrows 206. Vias 17, 18, 19, have a width 207 as indicated by the distance between facing arrows 209.

Figure 2B:
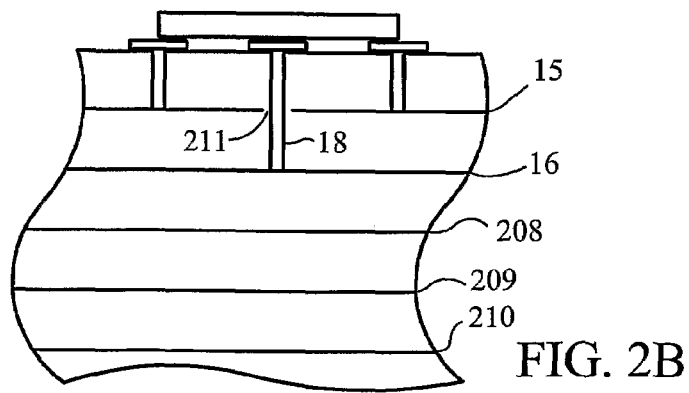
FIG. 2B is another side sectional view showing power and ground planes and connection of the multi terminal conditioner to the power and ground planes.

FIG. 2B shows additional structure underneath conditioner 201 including additional power, ground, and/or signal planes 208, 209, 210, and aperture 211 through which the conductive path in via 18 passes without shorting to power plane 15. Additional power, ground and/or signal planes may exist in any particular board.

In operation, power feed from source 11 through one or more power planes provides power for active circuitry in the IC mounted in region 8 to operate. Conditioners mounted to the elements of array 7, one conditioner per array element, decouple transients otherwise induced in power due to switching and the like in the active circuitry of the IC.

FIGS. 3A to 3K are perspective views of exterior surfaces 3A to 3K of certain novel energy conditioners disclosed herein. In FIGS. 3A to 3K, "C" denotes electrically conductive material and "D" denotes dielectric material (electrically insulating). The electrically conductive portions, C, may be referred to herein as bands or outer terminals.

Figure 3A:
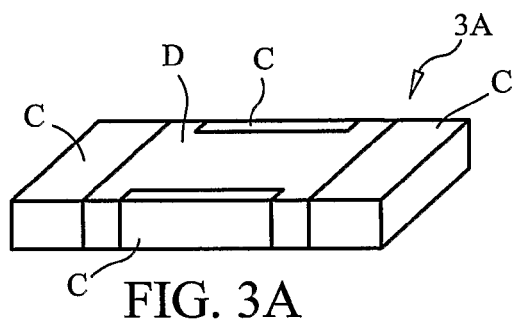
FIGS. 3A to 3K are perspective views of exterior surfaces of novel energy conditioners disclosed herein, particularly showing surfaces of conductive band structures, C, and surfaces of dielectric material, D.
Figure 3B:
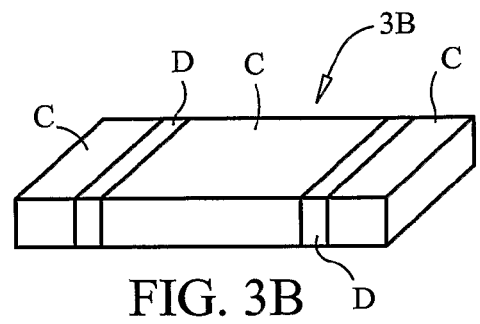
Figure 3C:
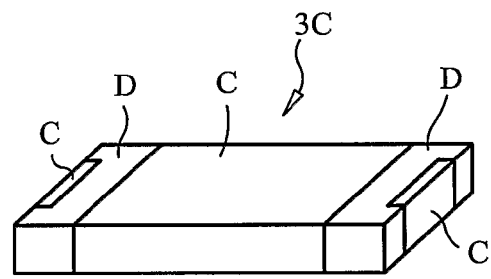
Figure 3D:
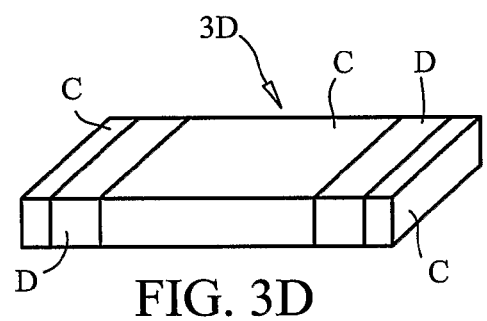
Figure 3E:
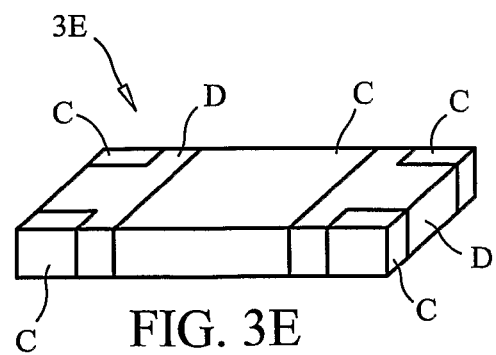
Figure 3F:
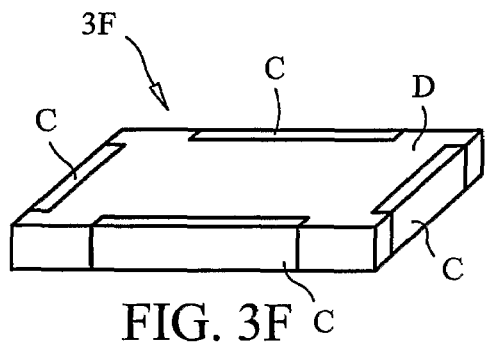
Figure 3G:
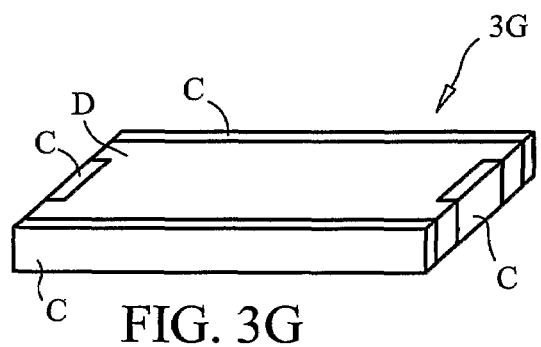
Figure 3H:
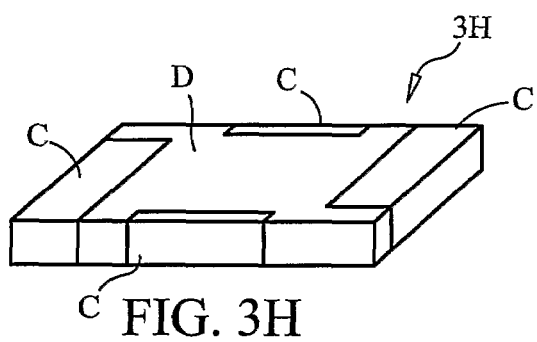
Figure 3I:
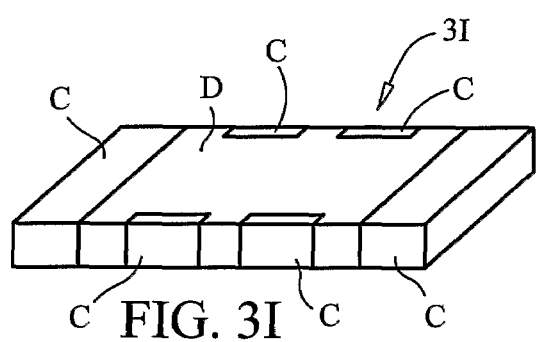
Figure 3J:
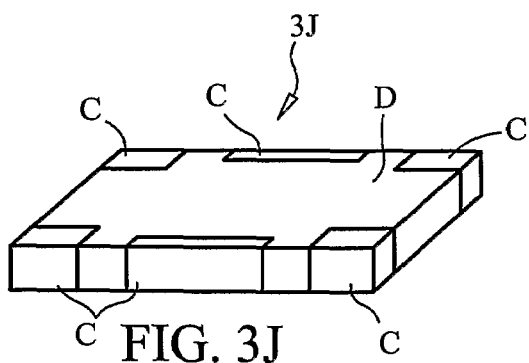
Figure 3K:
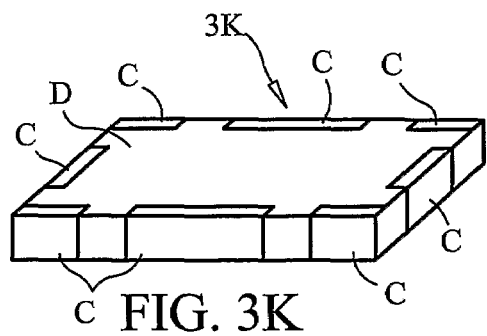

FIG. 3A shows conductive band C, each labeled C1, C2, C3, and C4, and FIG. 3G shows conductive bands C, each labeled C1-C6, for purpose of discussion with energy conditioner internal structure disclosed herein below.

Figure 4O:
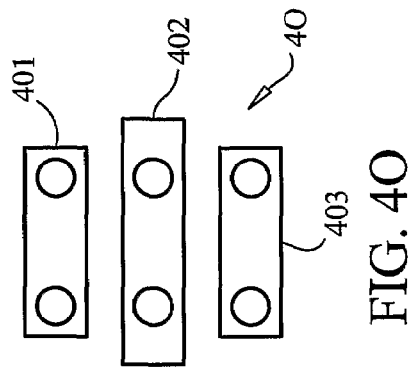
FIGS. 4A-O are plan views each showing arrangements of conductive elements of mounting surface structure, including conductive pad and/or via structure to which novel discrete component energy conditioners disclosed herein may be mounted.

FIG. 4A-4O each show one arrangement of conductive elements of mounting structure for mounting a single one of the novel discrete energy conditioners. These arrangements are also referred to as land patterns. The mounting surface may be a surface of a PC board, first level interconnect, or semiconductor chip.

FIG. 4A shows an arrangement 4A of mounting surface structure including a set of three generally rectangularly shaped conductive pads 401, 402, 403. Conductive pads 401, 402, 403, have relatively long sides (unnumbered) and relatively short sides. The relatively short sides are labeled 401A, 402A, 403A. Relatively short sides 401A, 402A, 403A are aligned with one another such that a straight line segment could contact substantially all of short sides 401A, 402A, 403A. Conductive pad 401 contains vias 401V1, 401V2. Conductive pad 402 contains vias 402V1, 402V2. Conductive pad 403 contains vias 403V1, 403V2. Vias 401V1, 402V1, and 403V1 are aligned such that a single line segment could intersect them. Vias 401V2, 402V2, and 403V2 are aligned such that a single line segment could intersect them.

In alternatives to arrangement 4A, pads may have different sizes, lengths, or widths from one another. For example, pad 402 may be shorter than pads 401, 403.

In another alternative to arrangement 4A, outer pads 401, 403 may have a different shape than central pad 402. For example, outer pads 401, 403 may include convex central regions and/or flared end regions. For example, outer pads 401, 403 may be the same length as one another but shorter or longer than central pad 402.

In another alternative to arrangement 4A, certain vias may have a diameter larger than the width or length of the pad to which they are attached such that the via is not entirely contained within the footprint of a conductive pad. For example, a via diameter may be equal to a width of a conductive pad, 1.5, 2, or 3 times a width of the conductive pad.

In another alternative to arrangement 4A, certain vias may have different cross-sectional diameters from one. For example, cross-section diameters of vias connecting to the central pad 402 may be ⅓, ½, 1, 1.5, 2, or 3 times the cross-sectional diameter of vias connecting to outer pads 401, 403.

In another alternative to arrangement 4A, vias 402V1, 402V2 may be spaced from one another by more than or less than the spacing between vias 401V1, 401V2 and the spacing between 403V1, 403V2.

In another alternative to arrangement 4A, each conductive pad may contain one, two, three, or more vias. For example, each conductive pad 401, 402, 403 may contain a single via.

For example, pads 401 and 403 may contain 2 or 3 vias and pad 402 may contain one via. For example, pads 401 and 402 may contain 1 via and pad 402 may contain 2 or 3 vias.

In another alternative to arrangement 4A, the pads may not exist in which case just conductive vias exist in one of the foregoing arrangements. For example, two parallel rows of three vias.

In another alternative to arrangement 4A, some pads may have connected vias and some may not. For example, central pad 402 may contain 1, 2, 3, or more vias and outer pads 401, 403 may contain no vias. For example, central pad 402 may contain no vias and each outer pad 401, 403, may contain 1, 2, 3, or more vias.

In another alternative to arrangement 400A, the cross-sections of vias may not be circular, such as elliptical, elongated, or irregular.

FIGS. 4B-4L show various arrangements of the alternatives discussed above.

FIG. 4B shows arrangement 4B of mounting structure having vias of pad 402 more widely spaced from one another than the spacing between vias of either pad 401 or pad 403.

FIG. 4C shows arrangement 4C of mounting structure having vias having elongated elliptical cross-sections.

FIG. 4D shows arrangement 4D of mounting structure having a single via in each one of pads 401, 402, 403.

FIG. 4E shows arrangement 4E of mounting structure having outer pads 401, 403 having one centrally located via.

FIG. 4F shows arrangement 4F of mounting structure having pads 401, 402, 403 having no vias. In this alternative, conductive lines may radiate along the surface of the structure from each pad.

FIG. 4G shows arrangement 4G of mounting structure having pads 401, 402, 403 each having three vias, each via in each pad aligned with one via in each one of the other two pads.

FIG. 4H shows arrangement 4H of mounting structure having a single via in each pad, and in which the central pad 402 is short than the outer pads 401, 403.

FIG. 4I shows arrangement 400I of mounting surface structure having equal length pads 401, 402, 403, and in which the central pad 402 connects to only one via whereas the outer pads 401, 402 connect to 2 vias.

FIG. 4J shows arrangement 4J of mounting structure having three pairs of vias, and no pads.

FIG. 4K shows arrangement 4K of mounting structure having outer pads 401, 403 connecting to two vias and central pad 202 connecting to three vias.

FIG. 4L shows arrangement 4L of mounting structure having central pad 402 connecting to one via and outer pads 201, 203 having no vias.

Figure 4N:
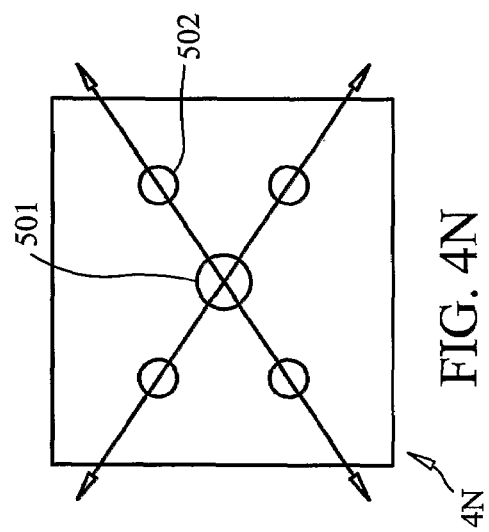
Figure 4M:
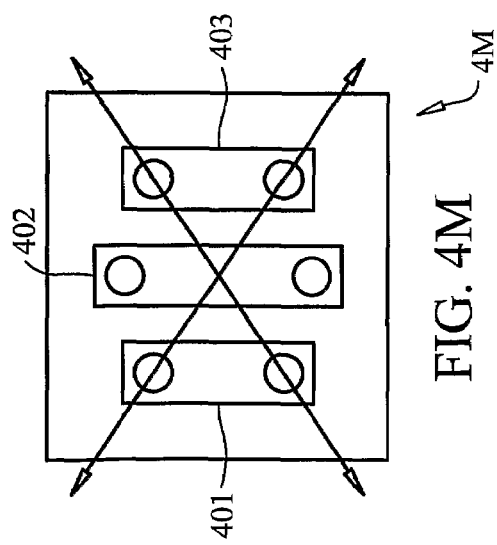

FIG. 4M shows mounting structure 4M having central pad 402 extending further than pads 401, 403, and vias in central pad 402.

FIG. 4N shows mounting structure 4N having via 410 having a larger diameter than via 411. Moreover, larger via 410 is more centrally located than the other smaller diameter vias. That is, FIG. 5C contemplates benefits from conductively filled or lined vias of different dimensions from one another, and in which the larger vias are more centrally located relative to the energy conditioner to which the connect.

FIG. 4O shows mounting structure 4O having central pad 402 extending symmetrically further than pads 401, 403.

Preferably, vias in each pad are spaced symmetrically on either side of the center of the pad. Preferably, the arrangement of vias is symmetric about the center point of central pad 202.

The inventors contemplate all variations of arrangements of mounting structures (pads and vias combinations, sizes, and shapes) and energy conditioners mounted therein that provide conductive connection between the conductive elements of the mounting structure and A, B, and G master electrodes (defined herein below) internal to the energy conditioner. The A, B, and G master electrodes either have regions forming part of the surface of the energy conditioner or internally physically contact conductive bands (outer electrodes) forming part of the surface of the energy conditioner. Thus, all variations of the conductive band structures and mounting structure that provide suitable connection to the A, B, and G master electrodes are contemplated. In addition, the inventors contemplate all variations of energy conditioners lacking conductive band (outer electrodes) that can be mounted on and soldered (or conductively pasted) to the board thereby conductively connecting the A, B, and G master electrodes to the conductive regions of the mounting structure.

Herein, conductive integration region, means either a conductive band or equivalent solder providing the contact to tabs of layers of a master electrode thereby conductively integrating those conductive layers to one master electrode. Tabs mean those portions of conductive layers of an internal structure of an energy conditioner that extend to the upper, lower, left or right side surfaces of the internal structure. Main body portions of conductive layers of an internal structure means those portions of the conductive layers that do not extend to the upper, lower, left or right side surfaces of the internal structure.

Thus, the inventors contemplate all combinations of the mounting structure configurations for mounting a conditioner to a surface and (1) either conductive band configurations or exposed A, B, and G master electrodes surfaces of energy conditioners that provide suitable connections for the A, B, and G master electrodes.

Some combinations of novel energy conditioner and surface mounting structure provide (1) a first conductive and mechanical contact, such as a solder connection, to at least one and more preferably all conductive bands connected to one side of the A and B master electrodes, (2) a second conductive and mechanical contact, such as a solder contact, to at least one and preferably all conductive bands connected to the opposite side of the A and B master electrodes, and (3) a third conductive contact to at least one and preferably all bands connected to both of the opposite ends of the G master electrode. The foregoing reference to electrical contact includes situations where DC current is blocked, such as where a dielectric cap or layer exists somewhere along a via.

Figure 5A:
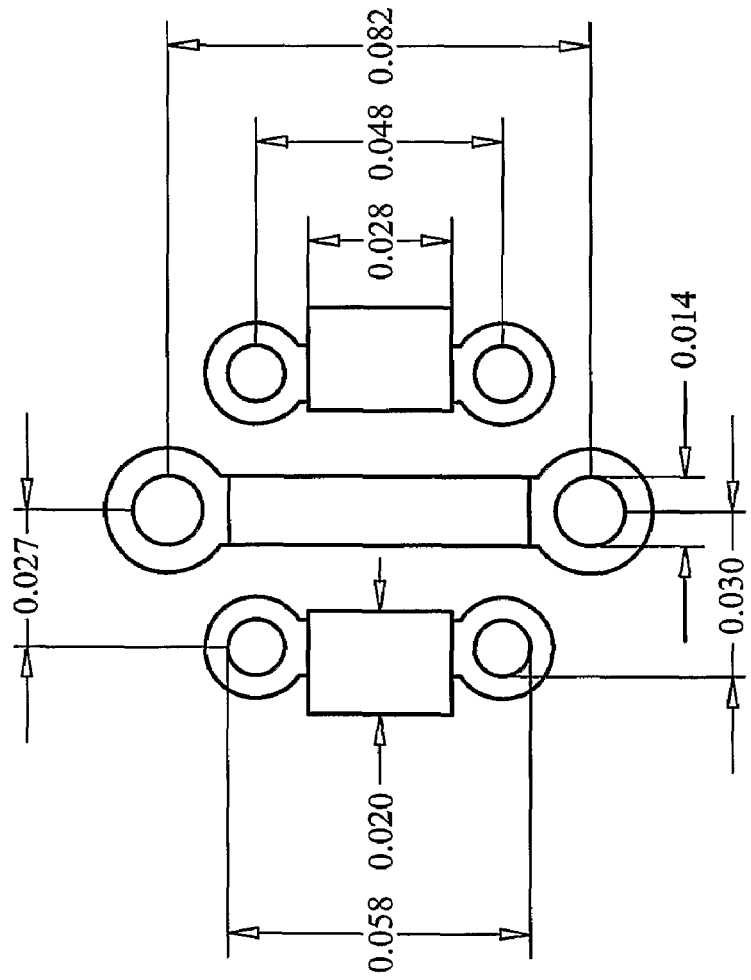
FIGS. 5A-5B are plan views showing geometric relationships of vias.

FIG. 5A shows geometric values and dimensions for one currently preferred mounting structure.

Figure 5B:
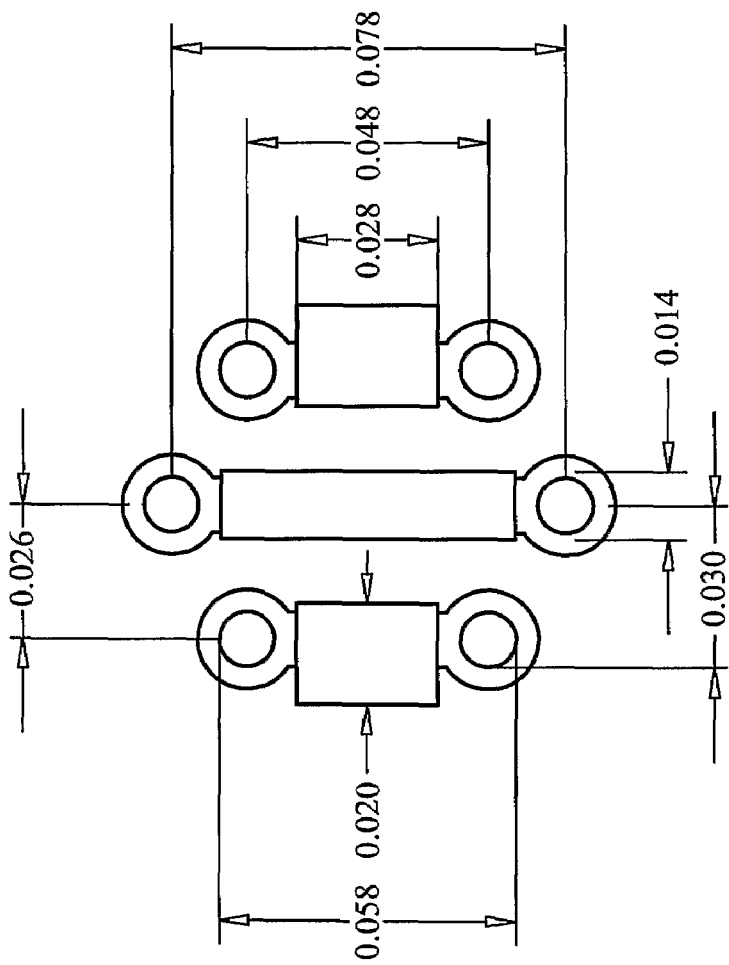

FIG. 5B shows geometric values and dimensions for another currently preferred mounting structure.

It has been determined by numerical calculations that the values shown in FIGS. 5A and 5B provided superior decoupling when 0603 X2Y type energy conditioners are mounted thereto. 0603 X2Y type capacitors have a capacitance of 1 to 100 nano farads, and nominal length, width, and thickness and height of 0.8, 0.6, 0.6, and 0.4 millimeters, respectively, as indicated for example by the URL: http://www.yageo.com/pdf/X2Y_series_10.pdf?5423212=EE8DCCAFD2263EBA74A6443AF7A8BC75&4620207=.

FIGS. 6A-6B each schematically show a combination of a novel energy conditioner having a certain exterior surface structure in operable location on mounting structure.

FIG. 6A shows an arrangement 6A of energy conditioner 601 on mounting structure 4A. Conditioner 601 had exterior surface structure 3A. Conductive band C1 is on top of conductive pad 401. Part of conductive band C2 is on top (since its ends extend beyond) of a first end of conductive pad 402. Conductive band C3 is on top of pad 403. Conductive band C4 is on top of a second end of conductive pad 402. The first and second ends of conductive pad 402 are on opposite sides of energy conditioner 601 from one another. Vias and portions of pads hidden from view are shown in dashed lines.

FIG. 6B shows arrangement 6B of energy conditioner 602 mounted on arrangement 4O of FIG. 4O. Conditioner 602 also has exterior surface structure 3A. Conductive band C1, C3 contact near opposite ends of conductive pad 402. Conductive bands C4, C2 contact respectively to conductive pads 401, 403.

FIG. 6C shows arrangement 6C of energy conditioner 603 mounted on mounting structure 4J showing alignment of conductive bands of conditioner 603, and also solder, on vias of mounting structure 4J.

FIGS. 7-12 show circuits including an energy conditioner having A, B, and G master electrodes, which relate to the special properties of such conditioners. The inventors have determined that connection of the G master electrode at least two points, preferably at two points on opposite sides from one another, provides significant advantages. This is in spite of the fact that the G master electrode is a single conductive structure wherein location of connection would not be relevant in a lumped circuit representation. Circuit diagrams rely upon a lumped circuit model for accuracy of representation. In order to represent this geometric requirement relating to distributed circuit design in lumped circuit figures, the inventors schematically represent the energy conditioners as devices having at least 3 terminal device, with A, B, G terminals. More terminals may exist for each master electrode, and additional master electrodes may be integrated into the same component. The inventors have also determined that relative locations of A, B, and G electrode terminals relative to the A, B, and G master electrode structures, may affect performance of the energy conditioners. FIG. 7-12 therefore show circuits peculiar to this type of energy conditioner.

In FIGS. 7-12, external terminal A conductively connects to the A master electrode, external terminal B conductively connects to the B master electrode, external terminal G1 conductively connects to the G master electrode. More specifically as used in FIGS. 7-12, embodiments having at least 2 G external terminals, such as a G1 and G2, a first side of the G master electrode, and external terminal G2 conductively connects to a different side of the G master electrode.

FIGS. 7-12 each show conditioner 700, and external terminals A, B, G1, and G2. The G master electrodes is represented by portions 702, 705, and the A and B master electrodes are represented respective by flat plate elements 703, 703. Internal to conditioner 700, the G master electrode is spaced between or acts to shield the effects of charge buildup on the A master electrode from the B master electrode. This is schematically represented by the portion 702 of the G master electrode extending between the flat plate elements 703, 704 of the A and B master electrodes. G master electrode portion 705 schematically represents shielding by the G master electrode of the A and B master electrodes relative to space outside conditioner 700.

Figure 7:
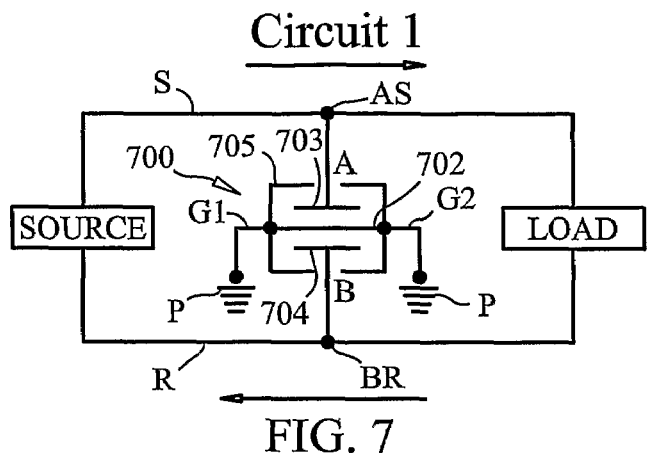
FIG. 7 is a partial schematic of circuit one for use with an energy conditioner having A, B, and G master electrodes.

FIG. 7 show a circuit 1 configuration for a conditioner 700 having A, B, and G master electrodes. In circuit one, external terminal A conductively connects to node AS of conductive path S between a source of electrical power, SOURCE, and a load, LOAD. In addition, external terminal B conductively connects to node BR of a return conductive path R between LOAD and SOURCE. In addition, external G1 and G2 terminals both conductively connect to a source of ground/constant potential P. Arrows above and below conductive paths between SOURCE and LOAD indicate that current flows in a loop.

Figure 8:
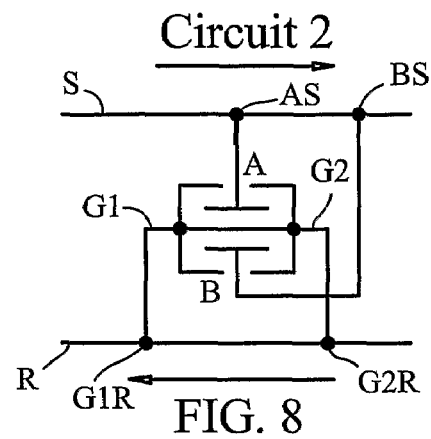
FIG. 8 is a partial schematic of circuit two for use with an energy conditioner having A, B, and G master electrodes.

FIG. 8 shows a circuit 2 configuration wherein external terminal A is tied to node AS on path S, external terminal B is tied to node BS also on path S, external terminal G1 is tied to node G1R on path R, and external terminal G2 is tied to node G2R also on path P.

Figure 9:
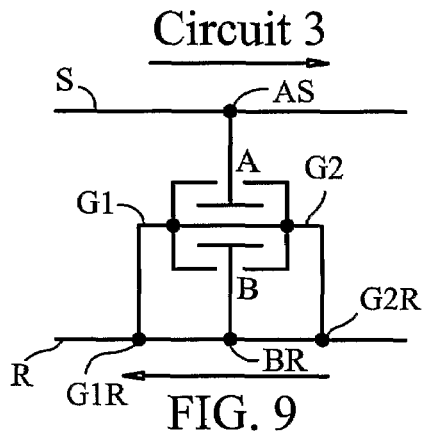
FIG. 9 is a partial schematic of circuit three for use with an energy conditioner having A, B, and G master electrodes.

FIG. 9 shows a circuit 3 configuration wherein external terminal A is tied to node AS on path S, external terminal B is tied to node BR on path R, external terminal G1 is tied to node G1R on path R, and external terminal G2 is tied to node G2R no path R.

Figure 10:
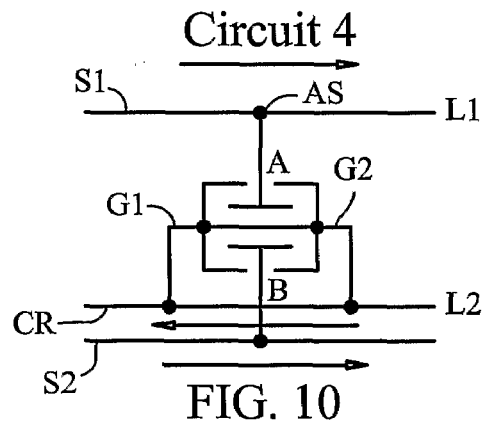
FIG. 10 is a partial schematic of a circuit four for use with an energy conditioner having A, B, and G master electrodes.

FIG. 10 shows a circuit 4 configuration wherein external terminal A is tied to a node on path S, and external terminals G1, B, and G2 are tied to nodes on path R.

Figure 11:
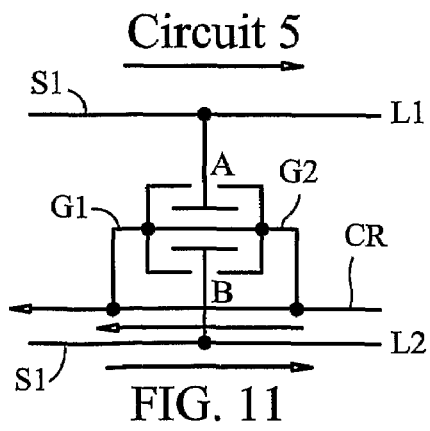
FIG. 11 is a partial schematic of a circuit five for use with an energy conditioner having A, B, and G master electrodes.

FIG. 11 shows a circuit 5 configuration wherein external terminal A is tied to a node on source path S1 from a first source to a load, external terminal B is tied to a node S2 on a path from a second source to a load, and external terminals G1 and G2 are tied to a common return path CR.

Figure 12:
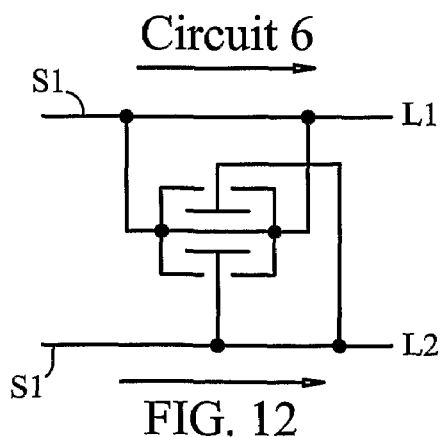
FIG. 12 is a partial schematic of a circuit six for use with an energy conditioner having A, B, and G master electrodes.

FIG. 12 shows a circuit 6 configuration wherein external terminal A is tied to a node on path R, external terminal B is tied to a node on path R, and external terminals G1 and G2 are tied to nodes on path S.

Relation of Internal Structure to External Structure of Energy Conditioners

FIGS. 13-57 generally show structure internal to the external surface 3A to 3K of FIGS. 3A-3K. The configuration of conductive layers of FIGS. 13-33 can be arranged relative to the external surfaces 3A to 3K so that the conductive layers of the A master electrode contact the same conductive band or bands as one, the conductive layers of the B master electrode contact the same conductive band or bands as one, and the conductive layers of the G master electrode contact the same conductive band or bands as one. Alternatively, instead of conductive bands, solder applied to the sides of the conditioners may conductively contact the conductive layers of the A master electrode to one another, the conductive layers of the B master electrode to one another, and the conductive layers of the G master electrode to one another. The same solder contacts may also contact corresponding conductive regions of the mounting structures shown in FIGS. 4A to 4O.

Meaning of "Plate", and Interconnector and IC Alternative Embodiments

The term "plate" herein generally is used to simplify explanation by defining a combination of a dielectric under layer with none, one, or more than one distinct conductive over layers. However, the relevant structure is the sequence of conductive layers separated by dielectric material. The hidden surface of the structures referred as plates in the following figures represents a dielectric surface; that is, dielectric material vertically separating the defined conductive layers from one another. In discrete energy conditioner component embodiments, the structure are often formed by layering dielectric precursor material (green material) with conductive layer precursor material (conductive paste or the like), firing that layered structure at temperatures sufficient to convert the dielectric precursor to a desired structurally rigid dielectric material and to convert the conductive precursor layer to a high relatively conductivity (low resistivity) conductive layer. However, embodiments formed in interconnects and semiconductor structures would use different techniques, including conventional lithographic techniques, to fabricate equivalent or corresponding structures to those shown in FIGS. 13-48, 50, 52, 54, and 56. Importantly, the conductive bands and solder connections for stacked layers discussed herein below would in many cases be replaced by an array of conductively filled or lined vias selectively connecting conductive layers of the same master electrode to one another. Preferably, those vias would be spaced to selectively contact the tab regions of the A, B, and G layers discussed herein.

Regardless of the mechanism of formation, it is the existence of the master electrodes' morphologies, assembly with external conductive structure, assembly with mounting structure, and integration into circuits 1-6 that are functionally important for decoupling.

Common Features of Internal Structure of Energy Conditioners

A master electrode refers to the conductive layers or regions internal to an energy conditioner and the structure internal to the energy conditioner physically contacting those conductive layers or regions so that they form one integral conductive structure.

Internal structure of energy conditioners includes conductive layers or regions spaces by dielectric material from other conductive layers or regions. The conductive layers or regions each have tab regions where are regions that extend to an edge or periphery of the dielectric material or equivalently to the surface of the internal structure. In an energy conditioner, an edge of each tab region of each conductive layer is contacted to a conductive integration region. The external surface conductive structure may be either conductive bands integral to the discrete energy conditioner or by solder employed also to mount the energy conditioner internal structure to mounting structure. In energy conditioner internal structures having a plurality of conductive layers or regions designed to form a single master electrode, tabs of those conductive layers or regions are vertically aligned in the stack of layers so that a single conductive tab may conductively connect those conductive layers or regions to thereby form a master electrode.

Alternatively, or in addition to conductive bands or solder connecting to externally exposed edges of conductive layers or regions of a master electrode, conductively filled or lined vias may selectively connect to the same conductive layers or regions.

Relationship Between Internal Structures of Energy Conditioners and External Structure of Energy Conditioners Each one of the internal structures of energy conditioners shown in FIGS. 13-48, 50, 52, 54, and 56 may reside in each one of external surface 3A to 3K of FIGS. 3A-3K in two distinct configurations. In one configuration, a first set of tabs of a G conductive layer of the G master electrode are on the left and right sides (as shown in FIGS. 3A to 3K) of the external surfaces 3A to 3K. In the other configuration, the same first set of tabs of that same G conductive layer of the G master electrode are on the upper and lower sides (as shown in FIGS. 3A to 3K) of the external surfaces 3A to 3K. In each configuration of the internal structures of energy conditioners shown in FIGS. 13-48, 50, 52, 54, and 56 and external surfaces 3A to 3K, the conductive layers of the A and B master electrodes each have a region that extends into contact with at least one conductive band (or solder, when solder is applied) of the corresponding one of external surfaces 3A to 3K.

Relationship Between Internal Structures of Energy Conditioners, External Structure of Energy Conditioners, and Circuits 1-6

At least in circuits wherein the A and B master electrode are not tied to the same conductive path of the circuit (circuits 1, 3, 4, and 5; see FIGS. 7-12), the conductive layer or layers of the A master electrode do not contact the same conductive band on external surfaces 3A to 3K as the conductive layer or layers of the B master electrode.

At least in circuits wherein the A master electrode is not tied to the same conductive path of the circuit as the G master electrode (circuits 1-6; see FIGS. 7-12), the conductive layer or layers of the A master electrode do not contact the same conductive band on external surfaces 3A to 3K as the conductive layer or layers of the G master electrode.

At least in circuits wherein the B master electrode is not tied to the same conductive path of the circuit as the G master electrode (circuits 1, 2 and 6; see FIGS. 7-12), the conductive layer or layers of the B master electrode do not contact the same conductive band on external surfaces 3A to 3K as the conductive layer or layers of the G master electrode.

Features Common to Various Internal Structures Shown in FIGS. 13-56.

FIGS. 13-48, 50, 54, and 56 each show internal structures of energy conditioners.

FIGS. 13-40 and 45-48 all show embodiments of internal structures having at least one layer in which reside three separate conductive regions each having a tab, and each a conductive layer of an A, B or G master electrode.

Figure 33:
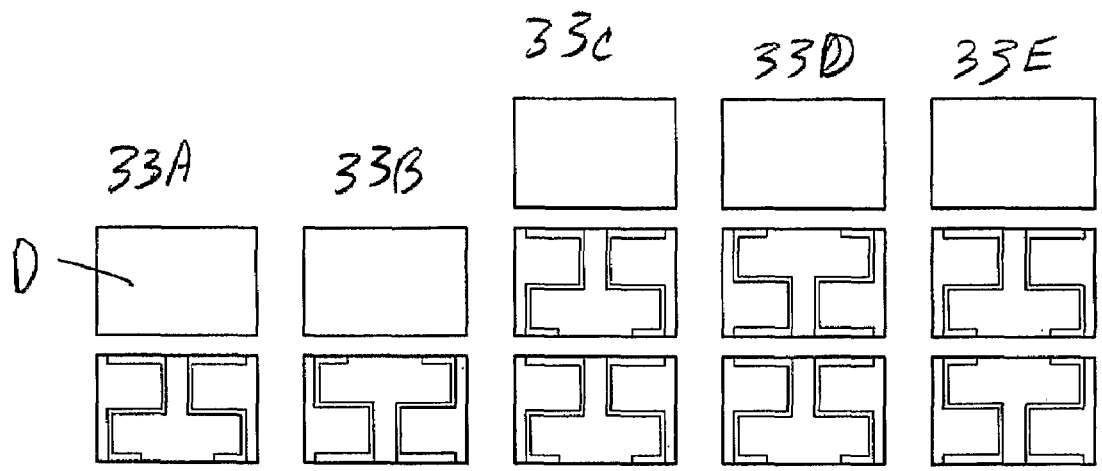
FIG. 33 is a set of exploded views of a stacks 33A-33E of plates of energy conditioners in which the plates in each stack are displaced in the plane of the paper.

FIGS. 13-28, and stacks 33A, 33B of FIG. 33 show embodiments of internal structures having a one plate build single layer containing three separate conductive regions each having a tab.

FIGS. 45-48 all Fig embodiments of internal structures having plates having four separate conductive layers each having a tab.

FIGS. 13-23 and 25-28 show stacks of plates that each have a conductive layer of an A master electrode and a conductive layer of a B master electrode in the same plate, and wherein two such plates are mirror images of one another about a line of symmetry extending vertically or horizontally in the plane of the paper of each figure.

FIGS. 13-40 all show embodiments of internal structures having plates having three separate conductive regions that each having a tab wherein one conductive region, a G layer, separates the other two conductive regions. In the plates in these figures having the three separate conductive regions, a second plate having the same pattern as the first plate having the G region, stacked on the first plate, and rotated 180 degrees relative to the first plate results tabs of the G region in each plate at least partially overlapping with one another, and parts of the tabs of the other conductive regions overlapping with one another, and parts of the G region overlapping with parts of the other two conductive regions.

FIGS. 50 and 52 show structures including only a single plate having a surface including a conductive layer of an A master electrode and a conductive layer of a B master electrode, and a single plate having a surface including a conductive layer of a G master electrode.

FIGS. 54 and 56 show structures including only a two plate each having a surface including a conductive layer of an A master electrode and a conductive layer of a B master electrode, and a single plate having a surface including a conductive layer of a G master electrode.

FIG. 37 and stacks 38E, 38G of FIG. 38, and stacks 40A-40C of FIG. 40 each show structures including plates having a substantial region of a conductive layer of an A master electrode opposing a corresponding region of a conductive layer of a B master electrode on another plate having no intervening conductive layer of a G master electrode there between.

FIG. 38 stack 38H and FIG. 40 stack 40C show structures in which the outermost conductive layers on one or both ends of the stack have a sequence of two or three conductive G layers.

Detailed Description of FIGS. 13-57

In the following figures, plates of a stack shown displaced horizontally or vertically in the page exist in the stack in the sequence as expanded horizontally or vertically in the page. Each stack includes a top and a bottom spaced from one another in a direction perpendicular to the face of the paper of the figures. In addition, each plate of each stack is shown in the figures as having in the plane of the paper a left side LS, right side RS, upper side US, and lower side LLS.

FIG. 13 shows plate 1300 that includes dielectric material uniformly extending to the LS, RS, US, and LLS. Conductive layer A1 designed to be part of the A master electrode, conductive layer B1 designed to be part of the B master electrode, and conductive layer G1 designed to be part of the G master electrode reside on the surface of dielectric material of plate 1300. Conductive layers A1 and B1 are separated from one another by (1) conductive layer G1 and exposed dielectric surface D on either side of conductive layer G1. Conductive layer A1 has a tab A1T extending to the entire LS, and also the far left sides of the US and LLS. Conductive layer B1 has a tab B1T extending to the entire RS, and also to the far right sides of the US and LLS. Conductive layer A1 has a main body portion A1M extending beyond tab A1T less than a majority of the distance from the LS to the RS on the lower half of plate 1300. Conductive layer B1 has a main body portion B1M extending beyond tab B1T less than a majority of the distance from the RS to the LS on the lower half of plate 1300. Conductive layer G1 has a first tab G1T1 in the middle of the US and a second tab G1T2 in the middle of the LLS. Conductive layer G1T has a main body portion extending to near the US to near both the RS and LS. A lower edge of G1M opposes portions of an upper edge of A1M and A2M. An upper edge of G1M on each side of G1T1 opposes the US across a dielectric region. The length of G1M, A1M, and B1M in the direction from the LLS to the US may be greater or lesser than as shown. These provide embodiments in which certain G or A and B layers in multi layer stacks have overlapped G or A and B main body portions. For example, the G1M may have a length in that direction of greater than one half the length from the LLS to the US.

In a first embodiment of internal structure of an energy conditioner, the internal structure includes only the single plate shown in FIG. 13. In this embodiment, the A, B, and G master electrodes are formed by each of the A1, B1, and G1 conductive layers.

FIG. 14 shows plate 1300 rotated by 180 degrees in the plane of the conductive layers relative to plate 1300 shown in FIG. 13.

In a second embodiment of internal structure of an energy conditioner, plate 1300 oriented as shown in FIG. 14 is stacked on plate 1300 oriented as shown in FIG. 13. In this embodiment, tabs G1T1 in one plate aligns with tab G1T2 in the other plate, enabling a conductive integration region to contact both tabs. Similarly, the A1T in both plates align, enabling conductive integration region to contact both plates. Similarly, the B1T in both plates align, enabling conductive integration region to contact both plates.

In a third embodiment, additional plates 1300 exist in a stack of internal structure, and preferably, there are an even number of plates, and every other plate has the 180 degree rotation orientation.

FIGS. 15-28 all provide alternative one plate build internal structure embodiment of FIG. 13.

FIGS. 15-24, 27, and 28 all provide alternative enabling stacking to provide alternative internal structures to the second and third embodiments of the FIGS. 13 and 14 stacks.

Features unique to FIGS. 15-28 compared to FIG. 13 are described below.

FIG. 15 includes tabs G1T1 and G1T2 having the same width.

FIG. 16 shows G having a G1T1 that is coextensive with G1M in the left to right direction.

FIG. 17 shows tabs A1T and B1T extending only to a portion of the LS and G1M extending beyond the left and right edges of G1T1.

FIG. 18 shows tabs A1T and B1T extending only to a portion of the LS and G1M coextensive with G1T1 in the left to right direction.

FIG. 19 shows A1T and B1T extending along the LS or RS from near the US to the lower end of the LS and along a portion of the LLS near the LS or RS, and tabs G1T1 and G2T2 equal in width.

FIG. 20 shows A1T and B1T extending along the LS or RS from near the US to the lower end of the LS and along a portion of the LLS near the LS or RS, and G1M coextensive with G1T1 in the left to right direction.

FIG. 21 shows tabs A1T1 in the US near the LS and A1T2 at the junction of the LS and LLS, and symmetric locations of tabs B1T1 and B1T2.

FIG. 22 shows tabs A1T1 in the US near the LS, A1T2 in the middle of the LS, and A1T3 in the LLS near the LS, and corresponding symmetric tabs for the B conductive layer.

FIG. 23 shows a tab A1T1 at the junction of the RS and US with a corresponding B1T2 tab at the junction of the LLS and RS, and a tab A1T2 in the LLS near the RS and a corresponding B1T1 tab in the US near the left side.

FIG. 24 shows an asymmetry between tabs of the A and B conductive layers wherein the A conductive layer has two tabs (in the US and LLS near the LS) and the B conductive layer has three tabs (including tabs in the US and LLS near the right side and a tab in the RS).

FIG. 25 shows a plate having conductive layer A1 in the contacting having a tab A1T at the junction of the LS and US. FIG. 25 also shows conductive layer B1 having a tab B1T at the junction of the LS and the LLS. FIG. 25 also shows conductive layer G1 having tabs G1T1 and G1T2 at (1) the junction of the US and RS (2) the junction of the LS and LLS. Like the plates shown in FIGS. 13-24, the G conductive layer separates the A and B conductive layers. Unlike the plates shown in FIGS. 13-24, the tabs of each layer are coextensive with their main bodies. Unlike the plates shown in FIGS. 13-24 stacking of two plates having the pattern of FIG. 25 in a 180 rotated alignment does not result in alignment of tabs of A layers with one another, B layers with one another, or G layers with one another.

FIG. 26 is another view of a the plate shown in FIG. 25.

FIG. 27 shows A, B, and G layers each having tabs in the US and LLS and no tabs in the LS or RS.

FIG. 28 is similar to FIG. 27 however the G1T1 and G1T2 tabs have different widths.

FIGS. 29-32 show a set of related internal structures. Features common to these structures are describe with reference to numerals shown in FIG. 29.

FIG. 29-32 shows plates like plates 29A, 29B, of FIG. 29.

Plate 29A (and plates 30A, 31A, 32A) includes conductive layers A1, B1, and G1 separated from one another by dielectric D. Conductive layer A1 includes one or more tabs and main body portion A1M. Conductive layer B1 includes one or more tabs and main body portion B1M. Main body portion A1M extends in the upper half of plate 29A from near the LS to more than half way to the RS. Main body portion B1M extend in the lower half for plate 29A from near the RS to more than half way to the LS. Conductive layer G1 includes tabs G1T1 and G1T2 and material connecting between both tabs such that conductive layer G1 extends between A1 and B1. Tab G1T1 resides in middle of the US. Tab G1T2 resides in the middle of the LLS.

Plate 29B (and plates 30b, 31b, 32b) includes conductive layers A2, B2, and G2 separated from one another by dielectric D. Conductive layer A2 includes one or more tabs and main body portion A2M. Conductive layer B2 includes one or more tabs and main body portion B2M. Main body portion A2M extends in the lower half of plate 29B from near the LS to more than half way to the RS. Main body portion B2M extend in the upper half of plate 29A from near the RS to more than half way to the LS. Conductive layer G2 includes tabs G2T1 and G2T2 and material connecting between both tabs such that conductive layer G2 extends between A2 and B2. Tab G2T1 resides in middle of the US. Tab G2T2 resides in the middle of the LLS.

The main body portions are shown having different widths in the LLS to US direction from one another. They can have the same width. Alternatively, there may be a plurality of interleaved main body portions to each of the A1, B1, or A1, B1, A2, and B2 conductive layers. In embodiments with such interleaving, G1 conductive layers snake between the interleaved main body portions of the A and B conductive layers.

In each of the stacks of plates in FIGS. 29-32, a portion of the main body portion of A1 layer overlaps a portion of the main body of B2, and a portion of the main body of A2 overlaps a portion of the main body of B1.

FIGS. 29-32 are distinguished by the morphology of the tabs of the A1 and B1 conductive layers. In FIGS. 29, 30, and 32, the tabs of the A1 and A2 layers overlap and align. In FIG. 29 the A1 layers have tabs in the US and LLS near the RS, and the B1 and B2 layers have corresponding tabs near but not in the LS. In FIGS. 30 and 32 the tabs of the A layers are only in the LS and overlap and align, and the tabs of the B layers are only in the RS and overlap and align.

The tab alignment of FIGS. 29, 30, and 32 facilitates connection of A1 and A2 with conductive integration regions to form a single A master electrode. Similarly for the B1 and B2 layers, and the G layers, to form a B master electrode and a G master electrode.

In FIG. 31, the tabs of the A layers do not overlap or align. This structure facilitates conductive integration regions that provide for an A1 master electrode, an A2 master electrode, a B1 master electrode, and a B2 master electrode, as well as a G master electrode.

Alternate embodiments of the internal structures of FIGS. 29-32 include one or more additional plates 29A, 29B, 30A, 30B, 31A, 31B, 32A, 32B in any stack. Preferably, each stack contains plates of the same type (29, 30, 31, or 32). Preferably, each alternative internal structure has pairs of 29A and 29B, or 30A and 30B, or 31A and 31B, or 32A and 32B plates.

FIG. 33 shows stacks 33A-33E of plates. Each stack is also shown with a top plate D indicating that the conductive layers of the internal structure are preferably not exposed to conductive contact except at tab regions. Each one of stacks 33C-33E shows various arrangements to two plates each having a central G conductive layer separating A and B conducive layers. Stack 33C shows stacked plates having the same pattern aligned, and stacks 33D and 33E show stacked plates having the same pattern rotated 180 degrees.

Figure 34:
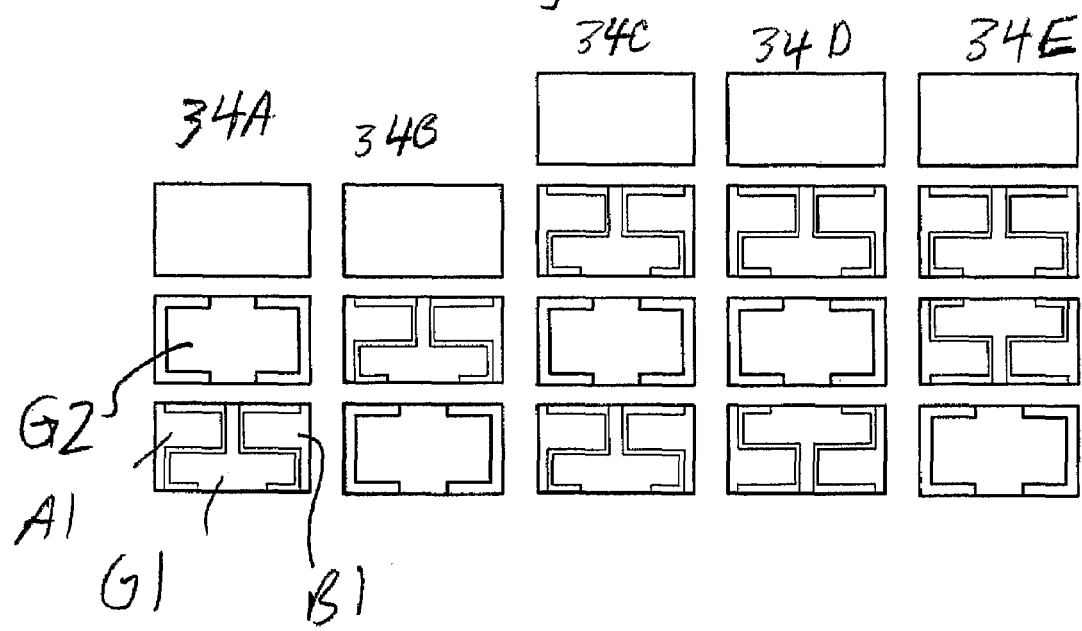
FIG. 34 is a set of exploded views of stacks 34A-34E of plates of energy conditioners in which the plates in each stack are displaced in the plane of the paper.

FIG. 34 shows stacks 34A-34E of plates in which each stack includes at least one plate having A1, B1, and G1 conductive layers, and at least one plate having only a G2 conductive layer having two tabs wherein tabs of the G1 and G2 conductive layers overlap enabling conductive integration region to conductively connect the G1 and G2 layers.

Alternative stacking embodiments to the FIGS. 33 and 34 internal structure embodiments include any additional one or more layers each having either A, B, and G conductive layers or only a G conductive layer.

Alternative stacking embodiments to the FIG. 33-FIG. 40 internal structure embodiments include any additional one or more layers each having either A, B, and G conductive layers or only a G conductive layer.

Figure 35:
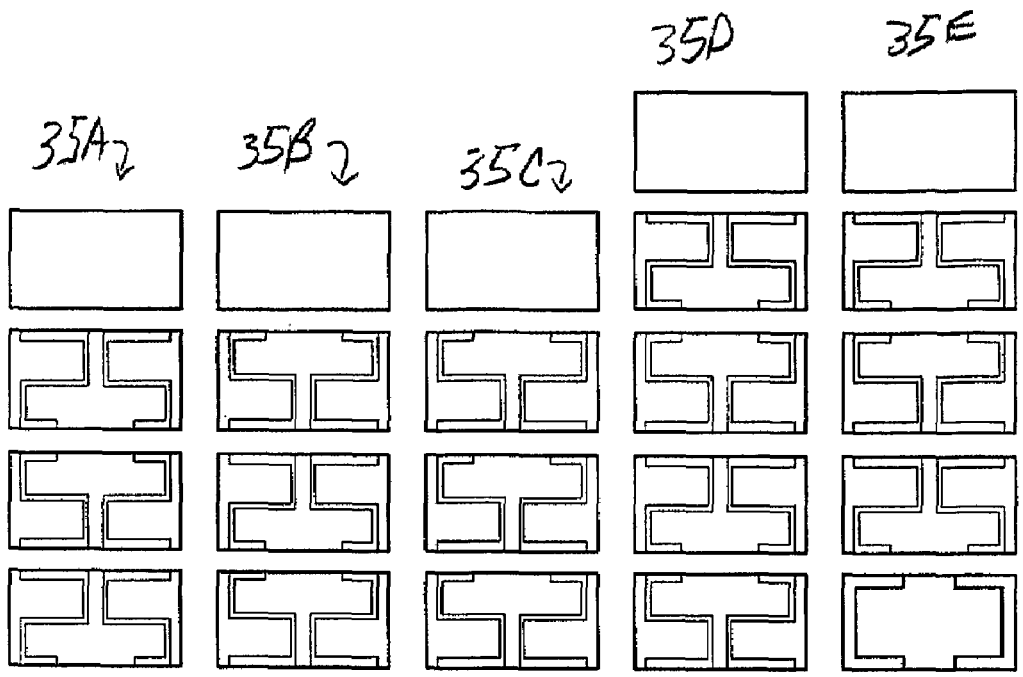
FIG. 35 is a set of exploded views of stacks 35A-35E of plates of energy conditioners in which the plates in each stack are also displaced in the plane of the paper.
Figure 36:
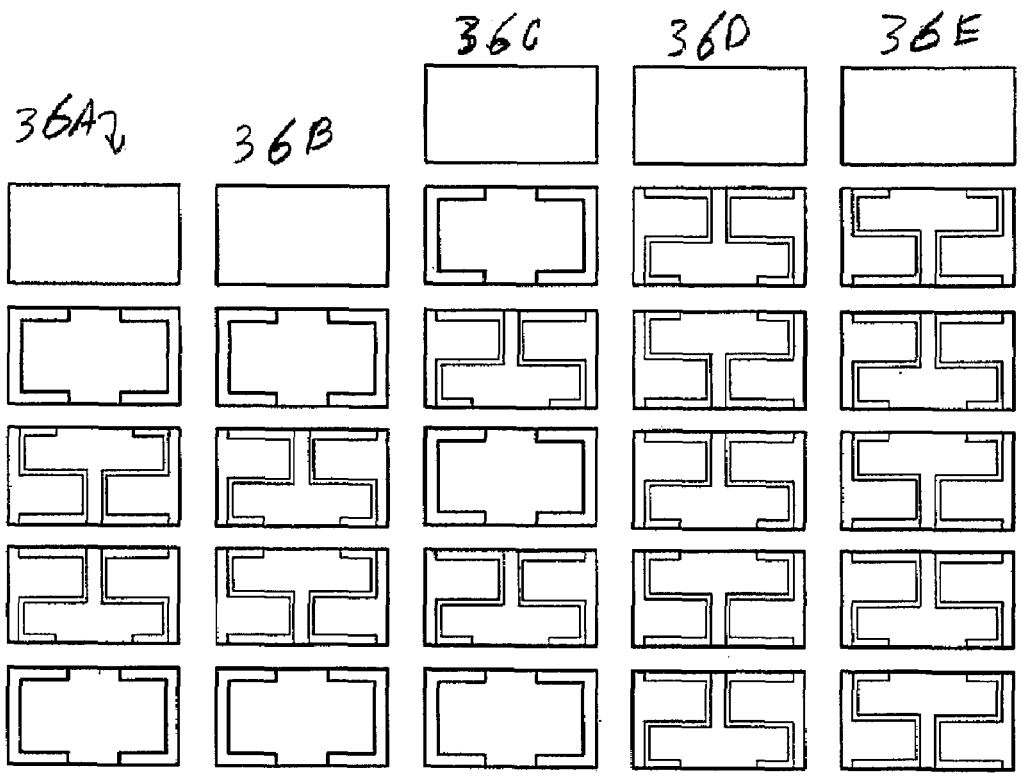
FIG. 36 is a set of exploded views of stacks 36A-36E of plates of energy conditioners in which the plates in each stack are also displaced in the plane of the paper.

FIGS. 35 and 36 show some of those alternative embodiments. FIG. 35 stacks 35A-35C show plates having A, B, and G conductive layers in all possible three plate alignments. Stack 35D shows plates having A, B, and G conductive layers alternatively rotated 180 degrees. Stack 35E shows a stack of three plates having A, B, and G conductive layers with a single plate having only a G conductive layer at the bottom.

Stacks 36A and 36B shows plates having only a G conductive layer at the top and bottom of a pair of plates having A, B, and G conductive layers in one case aligned and in the other case rotated 180 degrees. Stack 36C shows plates having only a G conductive layer interleaved between each plate having A, G, and G conductive layers. Stacks 36D and 36E show five plates each of which has A, B, and G layers in which each plate is rotated 180 degrees relative to its adjacent plates.

Preferably, plates having a single G layer extend over a majority of the surface area between the LS, RS, US, and LLS. Preferably, the plates having a single G layer overlap with all of the main bodies of the A and B conductive layers.

FIG. 37 shows a stack 3700 including plates 3700A, 3700B, 3700C, and 3700D. Each one of plates 3700 and 3700C contain conductive layers for the A, B, and G master electrodes separated by dielectric D. Plate 3700A includes conductive layer A1 that includes tab A1T extending over the entire LS and portions of the left end of the US and LLS. Plate 3700 also includes conductive layer B1 that includes tab B1 extending over the entire RS and portions of the right end of the US and LLS. Between A1 and B1 resides conductive layer G1 that winds between the main body portions of A1 and B1 to tabs G1T1 and G1T2 in the center of the US and LLS. Plate 3700B includes layer G2 having tabs G2T1 and G2T2 in the center of the US and LLS. Plate 3700C includes layers A2, B2, and G3, and it is a mirror image of plate 3700A. Plate 3700D is identical to plate 3700B. The stack 3700 has all tabs for the G layers aligned in the center of the US and LLS so that the G layers between A and B layers as well as the G layers above or below A and B layers are integrated into the G master electrode. Alternatively, stack sequences are feasible, including the plate sequence 3700A, 3700B, 3700C, and 3700D followed or preceded by any number of repetitions of either 3700C, 3700D or 3700A, 3700B; by including 2 or more of plates of the form of 3700B/3700D instead of single plates, and not including the central G conductive layer in one, or alternating ones of the plates of the form 3700A/3700C, and including one, two, or more plates of the form of 3700B/3700D at one or both ends of the stack.

FIG. 38 shows stacks, 38A to 38H each including additional alternative stacks of the plates 3700A to 3700D. Note in particular that stacks 38A, 38B, and 38C have less than 4 plates; one, two, and three plates or layers, respectively.

Figure 39:
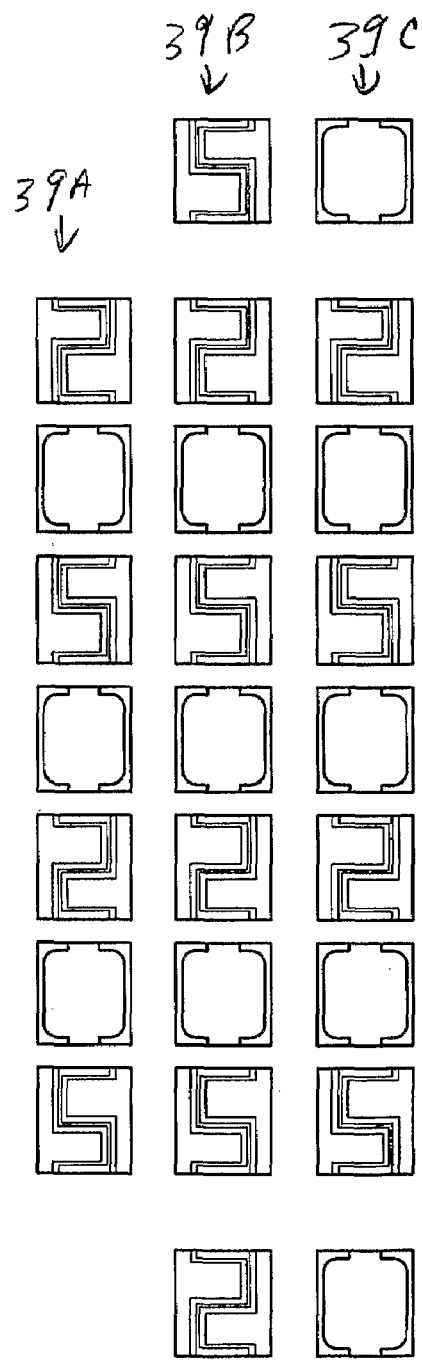
FIG. 39 is a set of exploded views of stacks 39A-39C of plates of energy conditioners in which the plates in each stack are displaced in the plane of the paper.

FIG. 39 shows stacks 39A-39C of plates. The stacks of plates in FIG. 39 each include plates having A, B, and G conductive layer and plates having only a G conductive layer. FIG. 39 illustrates that the number of layers may be increased and provides sequences of layers that may be repeated.

FIG. 40 shows stacks 40A, 40B, and 40C which employ the same plates 3700A, 3700B, 3700C, 3700D as the stack of FIG. 37. However, FIG. 40's sequence differs from the sequences in FIGS. 37 and 38 in that there are adjacent pair 4001 of mirror image layers M, M' where overlap regions of conductive surfaces for A1 and B1 layers oppose one another without an intervening G conductive layer for the G master electrode, like layers G2 and G4 of FIG. 3700. There are also plates where G conductive layers like layers G2 and G4 do bracket a layer in which A, B, and G conductive layers reside, like plate 4002. FIG. 40 shows paired layers M, M'. Alternatively, stack sequences may include any number of repeats of the pair of M, M' adjacent to one another with or without any of the layers having a single G layer, like layers G2 and G4 of FIG. 3700. Preferably, there is an odd total number of layers in which conductive layers exist, and an odd total number of layers in which only layers forming part of the G master electrode exist.

Alternative stacking embodiments to FIG. 33-FIG. 40 internal structure may utilize any number of disclosed electrode arrangements of the plates shown for FIGS. 13-24, 27-33, and 41-48. The inventors contemplate that these plates may be interchanged, sequenced, co-mingled, rotated, mixed and/or matched. Various arrangements may provide different energy conditioning effects.

FIGS. 41-48 each show a minimum one plate build for internal structure of an energy conditioner. FIG. 49 shows external structure of an energy conditioner having conducive bands in proper alignment to contact the A, B, and G layers of the plates shown in FIGS. 41-48.

FIGS. 41-44 each show a plate having only two conductive regions.

FIGS. 45-48 each show plates having four conductive regions.

FIG. 41 shows plate 41A including conductive layers A1 and B1 separated by dielectric D. A1 has tabs A1T1 in the US near the LS and A1T2 in the LLS near the LS such that those tabs would contact to front and back ends of conductive band C1 of external structure 49A of FIG. 49. Similarly, B1 tabs B1T1 and B1T2 are positioned to contact to front and back ends of conductive band C3 of external structure 49A. Conductive band C2 contacts no conductive layer of internal structure 41A. A1 has main body portion A1M extending in the upper half of plate 41A more than halfway to the RS. B1 has main body portion B1M extending in the lower half of plate 41A more than half way towards the LS such that A1M and B1M have portions that oppose one another in the direction from the US to the LLS.

FIG. 42 shows plate 42A that is similar to plate 41A except that A1M and B1M do not extend from the left or right side more than half way towards the opposite side, do not have portions that oppose one another in the direction from the US to the LLS, and each further in the direction from the US to the LLS. Nevertheless, the tabs of plate 42A are designed so that tabs of A1 and B1 contact C1 and C3 in the same manner as plate 41A.

FIG. 43 shows plate 43 having A and B layers similar to plate 41A except that they each extend to the LS or RS providing each a single tab extending over entirety of the LS or RS and a portion of the US and LLS. Plate 43A is designed so that neither A nor B contacts to conductive band C3.

FIG. 44 shows plate 44A having A and B layers similar to plate 42A except that they each extend to the LS or RS providing each a single tab extending over the entirety of the LS or RS and a portion of the US and LS. Plate 43A is designed so that neither A nor B contacts to conductive band C3.

FIGS. 45-48 show plates 45A-48A which respectively resemble plates 41A-44A with the following difference. Where in plates 41A-44A there was no tab at regions corresponding to contact with conductive band C3, in plates 45A-

48A there exists conductive layers G1, G2 which do contact conductive band C3. Each of FIGS. 45-48 shows a plate having four coplanar layers.

FIGS. 50-53 are views of energy conditioners including conductive layers on only two planes and various external structures.

FIG. 50 shows stack 50A containing plate 5000A and 5000B. An upper surface of plate 5000A is formed from surfaces of conductive layer A1, conductive layer B1, and exposed dielectric material D. An upper surface of plate 5000B is formed from conductive layer G1 and exposed dielectric material D. A1 has tabs A1T1 near the left hand end of the US and A1T2 at near lower left hand end of the LLS. G1 has tabs G1T1 in the middle of the US and G1T2 in the middle of the LLS. A1 does not extent to the RS, and B1 does not extend to the LS.

FIG. 51 schematically shows an energy conditioner defined by one arrangement of (1) stack 50A and (2) external structure 3A of FIG. 3A. In this arrangement, tabs A1T1 and A2T2 contact internal surfaces of conductive band C1, tabs G1T1 and G1T2 respectively contact internal surfaces of bands C2 and C4, and tabs B1T1 and B1T2 contact internal surfaces of conductive band C3.

In one alternative external structure, the third conductive integration structure and the fourth conductive integration structure form a single conductive band around the outer surface of said energy conditioner. The same alternative applies to FIGS. 53, 55, and 57.

FIG. 52 shows stack 52A including plates 5000A and 5200B. Plate 5200B differs from plate 5000B in that the tabs G1T1 and G1T2 of layer G1 are in the LS and RS as opposed to the US and LLS.

FIG. 53 schematically shows an energy conditioner defined by one arrangement of (1) stack 52A and (2) external structure 3A of FIG. 3A. Tabs A1T1 and B1T1 contact the internal surface of conductive band C3, tabs A1T2 and B1T2 contact the internal surface of conductive band C1, tab G1T1 contacts the internal surface of conductive band C2, and tab G1T2 contacts the internal surface of conductive band C4. In this energy conditioner, the A and B master electrodes are conductively tied together at the edges of the tabs by conductive bands C1, C3.

FIGS. 54-57 are views of energy conditioners including conductive layers on three planes and various external structures.

FIG. 54 shows stack 54A including plates 5000A and 5000B. Stack 54A also includes a second plate 5000C having the same layered pattern as plate 5000A and on an opposite side of plate 5000A relative to plate 5000B. Plate 5000C has elements A2T1, A2T2, B2T1, B2T2, A2M, and B2M aligned with corresponding elements of plate 5000A. Plate 5000C has conductive layers A2 and B2 having tabs aligned with corresponding tabs of plate 5000A, including tab A2T1, A2T2, B2T1, and B2T2.

Alternatively, for FIG. 54, plate 5000C may be replaced by a plate having a conductive pattern that is a mirror image of the conductive pattern on plate 5000A, the mirror defined by a vertical line passing through the center of conductive plate 5000A. In this alternative, conductive tabs A1T1 and A2T2, for example, are still vertically aligned and conductively connected by contacts to the inner surface of conductive band C1. However, in this alternative, A1M has a substantial overlap with B2M, and A2M has a substantial overlap with B1M. As with other embodiments, additional alternatives stacks include a repeating sequences of the three plates of 5000A, 5000B, and 5000C, and the alternative to 5000C noted above.

FIG. 55 schematically shows an energy conditioner defined by one arrangement of (1) stack 54A and (2) external structure 3A of FIG. 3A. In this structure, tabs for conductive layers of the same master electrode are aligned in the stack and contact conductive band structure. For example, tabs A1T1 and A2T1 are aligned and contact the internal surface of conductive band C1.

FIG. 56 shows stack 56A including plates 5000A and 5000B. Stack 56A also includes a second plate 5000C having the same layered pattern as plate 5000A and on an opposite side of plate 5000A relative to plate 5000B. Plate 5000C has conductive layers A2 and B2 having tabs aligned with corresponding tabs of plate 5000A, including tab A2T1, A2T2, B2T1, and B2T2.

In the alternative to 5000C in stack 56A, discussed above, A1M has a substantial overlap with B2M, and A2M has a substantial overlap with B1M. As with other embodiments, additional alternatives stacks include a repeating sequences of the three plates of 5000A, 5000B, and 5000C, and the alternative to 5000C noted above.

FIG. 57 schematically shows an energy conditioner defined by one arrangement of (1) stack 56A and (2) external structure 3A of FIG. 3A. In this structure, tabs for conductive layers of the same master electrode are aligned in the stack and contact conductive band structure. For example, tabs A1T1 and A2T1 are aligned and contact the internal surface of conductive band C1.

The invention claimed is:

1. An internal structure of an energy conditioner:
    wherein said internal structure has a left side surface, a right side surface, an upper side surface, a lower side surface, a top side surface, and a bottom side surface;
    wherein said internal structure comprises a dielectric material and a conductive material;
    wherein surfaces of said dielectric material and surfaces of said conductive material define said left side surface, said right side surface, said upper side surface, said lower side surface, said top side surface, and said bottom side surface;
    wherein said conductive material comprises a first A conductive layer, a first B conductive layer, and a first G conductive layer in a first plane;
    wherein said first A conductive layer, said first B conductive layer, and said first G conductive layer are electrically isolated from one another in said internal structure;
    wherein said first A conductive layer comprises at least one first A conductive layer first tab and a first A conductive layer main body portion;
    wherein said first B conductive comprises at least one first B conductive layer first tab and a first B conductive layer main body portion;
    wherein said first G conductive layer comprises at least a first G conductive layer first tab, a first G conductive layer second tab, and a first G conductive layer main body portion;
    wherein said first A conductive layer main body portion does not extend to any one of said left side surface, said right side surface, said upper side surface, and said lower side surface;
    wherein said first B conductive layer main body portion does not extend to any one of said left side surface, said right side surface, said upper side surface, and said lower side surface;
    wherein said first G conductive layer main body portion does not extend to any one of said left side surface, said right side surface, said upper side surface, and said lower side surface; and wherein said first G conductive layer is between said A conductive layer and said B conductive layer.

2. An energy conditioner comprising the structure of claim 1 and an energy conditioner external structure.

3. An assembly comprising the energy conditioner of claim 2 mounted on mounting surface structure, wherein said mounting surface structure consists of a first conductive region, a second conductive region, and a third conductive region;
wherein said first A conductive layer conductively connects to said first conductive region;
wherein said first B conductive layer conductively connects to said second conductive region; and
wherein said G conductive layer conductively connects to said third conductive region.

4. The assembly of claim 3 wherein said external conductive structure comprises a first conductive integration structure, a second conductive integration structure, and a third conductive integration structure;
wherein said first conductive integration structure contacts said first A conductive layer first tab and said first conductive region;
wherein said second conductive integration structure contacts said first B conductive layer first tab and said second conductive region;
wherein said third conductive integration structure contacts said first G conductive layer first tab and said third conductive region.

5. The assembly of claim 4 wherein said first conductive integration structure resides on a at least said left side surface, said second conductive integration structure resides on at least said right side surface, and said third conductive integration structure resides between said first conductive integration structure and said second conductive integration structure.

6. The assembly of claim 4 further comprising a fourth conductive integration structure that contacts said first G conductive layer second tab and said third conductive region.

7. The assembly of claim 4 wherein said third conductive integration structure also contacts said first G conductive layer second tab and said third conductive region.

8. The structure of claim 1:
wherein said first G conductive layer main body portion extends in a region near said upper side surface;
wherein said first A conductive layer main body portion extends, in a region closer to said lower side surface than said upper side surface, from said first A conductive layer first tab towards said left side surface, such that a portion of said first G conductive layer main body portion is between a portion of said first A conductive layer main body portion and said upper side surface; and
wherein said first B conductive layer main body portion extends, in a region closer to said lower side surface than said upper side surface, from said first B conductive layer first tab towards said right side surface, such that a portion of said first G conductive layer main body portion is between a portion of said first B conductive layer main body portion and said upper side surface.

9. The structure of claim 8:
wherein said first G conductive layer first tab extends to said upper side surface;
wherein said a first G conductive layer main body portion extends, in a region closer to said upper side surface than said lower side surface, further towards said left side surface than said first G conductive layer first tab; and
wherein said a first G conductive layer main body portion extends, in a region closer to said upper side surface than said lower side surface, further towards said right side surface than said first G conductive layer first tab.

10. The structure of claim 1 wherein said first A conductive layer first tab extends to at least one of said left side surface, said upper side surface, and said bottom side surface.

11. The structure of claim 1 wherein said first A conductive layer first tab extends to all of said lea side surface, a portion of said upper side surface at the intersection of said upper side surface and said left side surface, and a portion of said lower side surface at the intersection of said lower side surface and said left side surface.

12. The structure of claim 1 wherein said first A conductive layer first tab extends to only said left side surface.

13. The structure of claim 1 wherein said at least one first A conductive layer first tab consists of said first A conductive layer first tab and a first A conductive layer second tab;
wherein said first A conductive layer first tab extends to only said upper side surface; and
wherein said first A conductive layer second tab extends only to said lower side surface.

14. The structure of claim 1 wherein said at least one first A conductive layer first tab consists of said first A conductive layer first tab and a first A conductive layer second tab;
wherein said first A conductive layer first tab extends to only said upper side surface; and
wherein said first A conductive layer second tab extends only to a region at a corner of said lower side surface and said left side surface.

15. The structure of claim 1 wherein said at least one first A conductive layer first tab consists of said first A conductive layer first tab, a first A conductive layer second tab, and a first A conductive layer third tab;
wherein said first A conductive layer first tab extends to only said upper side surface;
wherein said first A conductive layer second tab extends only to said left side surface; and
wherein said first A conductive layer third tab extends only to said lower side surface.

16. The structure of claim 1 wherein said A conductive layer and said B conductive layer are mirror images of one another about a line extending from a center of said upper side surface to a center of said lower side surface.

17. The structure of claim 1:
wherein said first A conductive layer first tab extends to a region at a corner of said lower side surface and said left side surface;
wherein said first B conductive layer first tab extends to a region at a corner of said upper side surface and said right side surface;
wherein said first G conductive layer first tab extends to a region at a corner of said upper side surface and said left side surface; and
wherein said first G conductive layer second tab extends to a region at a corner of said lower side surface and said right side surface.

18. The structure of claim 1 wherein said G conductor main body portion has a G conductor main body portion area, said A conductor main body portion has an A conductor main body portion area, and said G conductor main body portion area is larger than said A conductor main body portion area.

19. The structure of claim 1 further comprising a second G conductive layer in a second plane;
wherein said second G conductive layer comprises at least a second G conductive layer first tab, a second G conductive layer second tab, and a second G conductive main body portion; and wherein said first G conductive layer and said second G conductive layer are stacked such that (1) said first G conductive layer first tab and said second G conductive layer first tab overlap and (2) said first G conductive layer second tab and said second G conductive layer second tab overlap.

20. The structure of claim 19 wherein said second G conductive layer includes no tabs other than said second G conductive layer first tab and said second G conductive layer second tab, and wherein said second G conductive layer occupies a majority of the area between said left side, said right side surface, said upper side surface, and said lower side surface.

21. The structure of claim 1:
wherein said first A conductive layer, said first B conductive layer, and said first G conductive layer form a first pattern;
further comprising a second A conductive layer, a second B conductive layer, and a second G conductive layer that form a second pattern in a second plane.

22. The structure of claim 21 wherein said second pattern is different from said first pattern.

23. An method of making an internal structure of an energy conditioner comprising:
providing said internal structure comprising a dielectric material and a conductive material;
wherein said internal structure has a left side surface, a right side surface, an upper side surface, a lower side surface, a top side surface, and a bottom side surface;
wherein surfaces of said dielectric material and surfaces of said conductive material define said left side surface, said right side surface, said upper side surface, said lower side surface, said top side surface, and said bottom side surface;
wherein said conductive material comprises a first A conductive layer, a first B conductive layer, and a first G conductive layer in a first plane;
wherein said first A conductive layer, said first B conductive layer, and said first G conductive layer are electrically isolated from one another in said internal structure;
wherein said first A conductive layer comprises at least one first A conductive layer first tab and a first A conductive layer main body portion;
wherein said first B conductive comprises at least one first B conductive layer first tab and a first B conductive layer main body portion;
wherein said first G conductive layer comprises at least a first G conductive layer first tab, a first G conductive layer second tab, and a first G conductive layer main body portion;
wherein said first A conductive layer main body portion does not extend to any one of said left side surface, said right side surface, said upper side surface, and said lower side surface;
wherein said first B conductive layer main body portion does not extend to any one of said left side surface, said right side surface, said upper side surface, and said lower side surface;
wherein said first G conductive layer main body portion does not extend to any one of said left side surface, said right side surface, said upper side surface, and said lower side surface; and
wherein said first G conductive layer is between said A conductive layer and said B conductive layer.

24. A method of using an internal structure of an energy conditioner:
wherein said internal structure has a left side surface, a right side surface, an upper side surface, a lower side surface, a top side surface, and a bottom side surface;
wherein said internal structure comprises a dielectric material and a conductive material;
wherein surfaces of said dielectric material and surfaces of said conductive material define said left side surface, said right side surface, said upper side surface, said lower side surface, said top side surface, and said bottom side surface;
wherein said conductive material comprises a first A conductive layer, a first B conductive layer, and a first G conductive layer in a first plane;
wherein said first A conductive layer, said first B conductive layer, and said first G conductive layer are electrically isolated from one another in said internal structure;
wherein said first A conductive layer comprises at least one first A conductive layer first tab and a first A conductive layer main body portion;
wherein said first B conductive comprises at least one first B conductive layer first tab and a first B conductive layer main body portion;
wherein said first G conductive layer comprises at least a first G conductive layer first tab, a first G conductive layer second tab, and a first G conductive layer main body portion;
wherein said first A conductive layer main body portion does not extend to any one of said left side surface, said right side surface, said upper side surface, and said lower side surface;
wherein said first B conductive layer main body portion does not extend to any one of said left side surface, said right side surface, said upper side surface, and said lower side surface;
wherein said first G conductive layer main body portion does not extend to any one of said left side surface, said right side surface, said upper side surface, and said lower side surface;
wherein said first G conductive layer is between said A conductive layer and said B conductive layer; and
said method comprising conditioning electrical energy in a circuit including said internal structure.

25. An energy conditioner comprising:
internal structure; and
an external structure;
wherein said internal structure has a left side surface, a right side surface, an upper side surface, a lower side surface, a top side surface, and a bottom side surface;
wherein said internal structure comprises a dielectric material and a conductive material;
wherein surfaces of said dielectric material and surfaces of said conductive material define said left side surface, said right side surface, said upper side surface, said lower side surface, said top side surface, and said bottom side surface;
wherein said conductive material comprises a first A conductive layer and a first B conductive layer in a first plane, and a first G conductive layer in a second plane, said second plane above said first plane;
wherein said first A conductive layer, said first B conductive layer, and said first G conductive layer are electrically isolated from one another in said internal structure;
wherein said first A conductive layer comprises at least one first A conductive layer first tab, a first A conductive layer second tab, and a first A conductive layer main body portion;

wherein said first B conductive comprises at least one first B conductive layer first tab, a first B conductive layer second tab, and a first B conductive layer main body portion;

wherein said first G conductive layer comprises at least a first G conductive layer first tab, a first G conductive layer second tab, and a first G conductive layer main body portion;

wherein said first A conductive layer first tab extends to said upper side surface near said left side surface;

wherein said first A conductive layer second tab extends to said lower side surface near said left side surface;

wherein said first A conductive layer main body portion extends in a region closer to said right side surface than said left side surface and closer to said upper side surface than said lower side surface;

wherein said first B conductive layer first tab extends to said upper side surface near said right side surface;

wherein said first B conductive layer second tab extends to said lower side surface near said right side surface;

wherein said first B conductive layer main body portion extends in a region closer to said left side surface than said right side surface and closer to said lower side surface than said upper side surface;

said external structure comprises a first conductive integration structure, a second conductive integration structure, a third conductive integration structure, and a fourth conductive integration structure;

wherein first conductive integration structure contacts to said first A conductive layer first tab and said first A conductive layer second tab;

wherein second conductive integration structure contacts to said first B conductive layer first tab and said first B conductive layer second tab;

wherein third conductive integration structure contacts to said first G conductive layer first tab; and wherein fourth conductive integration structure contacts to said first G conductive layer second tab.

26. The conditioner of claim 25 wherein said third conductive integration structure and said fourth conductive integration structure form a band on the outer surface of said energy conditioner.

27. The conditioner of claim 25 wherein said first G conductive layer first tab extends to said lower side surface and said first G conductive layer second tab extends to said upper side surface.

28. The conditioner of claim 25 wherein said first G conductive layer first tab extends to said left side surface and said first G conductive layer second tab extends to said right side surface.

29. The conditioner of claim 25:
wherein said conductive material comprises a second A conductive layer and a second B conductive layer in a third plane, said third plane above said first plane;
wherein said second A conductive layer comprises a second A conductive layer first tab and a second A conductive layer second tab; and
wherein said second B conductive layer comprises a second B conductive layer first tab and a second B conductive layer second tab.

30. The conditioner of claim 29:
wherein said second A conductive layer first tab overlaps with said first A conductive layer first tab; and
wherein said second B conductive layer first tab overlaps with said first B conductive layer first tab.

31. The conditioner of claim 30:
wherein said second B conductive layer comprises a second B conductive layer main body portion;
wherein said second A conductive layer comprises a second A conductive layer main body portion;
wherein said first A conductive layer main body portion is aligned with said second A conductive layer main body portion; and
wherein said first B conductive layer main body portion is aligned with said second B conductive layer main body portion.

32. The conditioner of claim 30:
wherein said second B conductive layer comprises a second B conductive layer main body portion;
wherein said second A conductive layer comprises a second A conductive layer main body portion;
wherein said first A conductive layer main body portion substantially overlaps with said second B conductive layer main body portion; and
wherein said first B conductive layer main body portion substantially overlaps with said second B conductive layer main body portion.

33. The conditioner of claim 25 wherein said external structure comprises no more than four conductive integration structures.

34. A method of making an energy conditioner comprising:
providing an internal structure; and
providing an external structure;
wherein said internal structure has a left side surface, a right side surface, an upper side surface, a lower side surface, a top side surface, and a bottom side surface;
wherein said internal structure comprises a dielectric material and a conductive material;
wherein surfaces of said dielectric material and surfaces of said conductive material define said left side surface, said right side surface, said upper side surface, said lower side surface, said top side surface, and said bottom side surface;
wherein said conductive material comprises a first A conductive layer and a first B conductive layer in a first plane, and a first G conductive layer in a second plane, said second plane above said first plane;
wherein said first A conductive layer, said first B conductive layer, and said first G conductive layer are electrically isolated from one another in said internal structure;
wherein said first A conductive layer comprises at least one first A conductive layer first tab, a first A conductive layer second tab, and a first A conductive layer main body portion;
wherein said first B conductive comprises at least one first B conductive layer first tab, a first A conductive layer second tab, and a first B conductive layer main body portion;
wherein said first G conductive layer comprises at least a first G conductive layer first tab, a first G conductive layer second tab, and a first G conductive layer main body portion;
wherein said first A conductive layer first tab extends to said upper side surface near said left side surface;
wherein said first A conductive layer second tab extends to said lower side surface near said left side surface;
wherein said first A conductive layer main body portion extends in a region closer to said right side surface than said left side surface and closer to said upper side surface than said lower side surface;
wherein said first B conductive layer first tab extends to said upper side surface near said right side surface;

wherein said first B conductive layer second tab extends to said lower side surface near said right side surface;

wherein said first B conductive layer main body portion extends in a region closer to said left side surface than said right side surface and closer to said lower side surface than said upper side surface;

said external structure comprises a first conductive integration structure, a second conductive integration structure, a third conductive integration structure, and a fourth conductive integration structure;

wherein first conductive integration structure contacts to said first A conductive layer first tab and said first A conductive layer second tab;

wherein second conductive integration structure contacts to said first B conductive layer first tab and said first B conductive layer second tab;

wherein third conductive integration structure contacts to said first G conductive layer first tab; and wherein fourth conductive integration structure contacts to said first G conductive layer second tab.

35. A method of using an energy conditioner, said energy conditioner comprising:

internal structure; and an external structure;

wherein said internal structure has a left side surface, a right side surface, an upper side surface, a lower side surface, a top side surface, and a bottom side surface;

wherein said internal structure comprises a dielectric material and a conductive material;

wherein surfaces of said dielectric material and surfaces of said conductive material define said left side surface, said right side surface, said upper side surface, said lower side surface, said top side surface, and said bottom side surface;

wherein said conductive material comprises a first A conductive layer and a first B conductive layer in a first plane, and a first G conductive layer in a second plane, said second plane above said first plane;

wherein said first A conductive layer, said first B conductive layer, and said first G conductive layer are electrically isolated from one another in said internal structure;

wherein said first A conductive layer comprises at least one first A conductive layer first tab, a first A conductive layer second tab, and a first A conductive layer main body portion;

wherein said first B conductive comprises at least one first B conductive layer first tab, a first A conductive layer second tab, and a first B conductive layer main body portion;

wherein said first G conductive layer comprises at least a first G conductive layer first tab, a first G conductive layer second tab, and a first G conductive layer main body portion;

wherein said first A conductive layer first tab extends to said upper side surface near said left side surface;

wherein said first A conductive layer second tab extends to said lower side surface near said left side surface;

wherein said first A conductive layer main body portion extends in a region closer to said right side surface than said left side surface and closer to said upper side surface than said lower side surface;

wherein said first B conductive layer first tab extends to said upper side surface near said right side surface;

wherein said first B conductive layer second tab extends to said lower side surface near said right side surface;

wherein said first B conductive layer main body portion extends in a region closer to said left side surface than said right side surface and closer to said lower side surface than said upper side surface;

said external structure comprises a first conductive integration structure, a second conductive integration structure, a third conductive integration structure, and a fourth conductive integration structure;

wherein first conductive integration structure contacts to said first A conductive layer first tab and said first A conductive layer second tab;

wherein second conductive integration structure contacts to said first B conductive layer first tab and said first B conductive layer second tab;

wherein third conductive integration structure contacts to said first G conductive layer first tab;

wherein fourth conductive integration structure contacts to said first G conductive layer second tab; and said method comprising conditioner electrical energy in a circuit containing said energy conditioner.

* * * * *

UNITED STATES PATENT AND TRADEMARK OFFICE
Certificate

Patent No. 7,630,188 B2                                                           Patented: March 8, 2011

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: William M. Anthony, Erie, PA (US); Anthony A. Anthony, Erie, PA (US); and David J. Anthony, Erie, PA (US).

Signed and Sealed this Fourteenth Day of August 2012.

*JARED FUREMAN*
*Supervisory Patent Examiner*
Art Unit 2836
Technology Center 2800